(12) United States Patent
Giovannini et al.

(10) Patent No.: US 10,607,670 B2
(45) Date of Patent: *Mar. 31, 2020

(54) MEMORY COMPONENTS AND CONTROLLERS THAT CALIBRATE MULTIPHASE SYNCHRONOUS TIMING REFERENCES

(71) Applicant: Rambus Inc., Sunnyvale, CA (US)

(72) Inventors: Thomas Giovannini, San Jose, CA (US); Scott Best, Palo Alto, CA (US); Lei Luo, Chapel Hill, NC (US); Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 218 days.

This patent is subject to a terminal disclaimer.

(21) Appl. No.: 15/794,177

(22) Filed: Oct. 26, 2017

(65) Prior Publication Data

US 2018/0137902 A1 May 17, 2018

Related U.S. Application Data

(63) Continuation of application No. 15/228,644, filed on Aug. 4, 2016, now Pat. No. 9,824,730, which is a continuation of application No. 14/003,722, filed as application No. PCT/US2012/029893 on Mar. 21, 2012, now Pat. No. 9,412,428.

(60) Provisional application No. 61/478,132, filed on Apr. 22, 2011.

(51) Int. Cl.
*G06F 12/00* (2006.01)
*G11C 7/22* (2006.01)
(Continued)

(52) U.S. Cl.
CPC .............. *G11C 7/222* (2013.01); *G11C 7/227* (2013.01); *G11C 29/023* (2013.01);
(Continued)

(58) Field of Classification Search
CPC ..... G11C 7/222; G11C 29/023; G11C 29/028; G11C 29/50012; G11C 29/227; G11C 29/56

See application file for complete search history.

(56) References Cited

U.S. PATENT DOCUMENTS 7,516,029 B2  4/2009  Kim et al.
7,586,800 B1  9/2009  Kornachuk
(Continued)

FOREIGN PATENT DOCUMENTS

WO   WO 2008-153645   12/2008

OTHER PUBLICATIONS

International Search Report and Written Opinion dated Oct. 30, 2012 in International Application No. PCT/US2012/029893. 9 pages.

(Continued)

*Primary Examiner* — Arvind Talukdar
(74) *Attorney, Agent, or Firm* — The Neudeck Law Firm, LLC

(57) ABSTRACT

A first timing reference signal and a second timing reference signal are sent to a memory device. The second timing reference signal has approximately a quadrature phase relationship with respect to the first timing reference signal. A plurality of serial data patterns are received from the memory device. The transitions of the first timing reference and the second timing reference determining when transitions occur between the bits of the plurality of data patterns. Timing indicators associated with when received transitions occur between the bits of the plurality of data patterns are received from the memory device. The timing indicators are each measured using a single sampler. Based on the timing indicators, a first duty cycle adjustment for the first timing reference signal, a second duty cycle adjustment for the second timing reference signal, and a quadrature phase adjustment are determined and applied.

13 Claims, 25 Drawing Sheets

(51) Int. Cl.
  *G11C 29/02* (2006.01)
  *G11C 29/50* (2006.01)
  *G11C 29/56* (2006.01)

(52) U.S. Cl.
  CPC ...... *G11C 29/028* (2013.01); *G11C 29/50012* (2013.01); *G11C 29/56* (2013.01)

(56) References Cited

U.S. PATENT DOCUMENTS

| | | |
|---|---|---|
| 8,264,906 B2 | 9/2012 | Chiu |
| 2002/0079940 A1 | 6/2002 | Beerstler et al. |
| 2004/0161068 A1 | 8/2004 | Zerbe et al. |
| 2005/0132158 A1 | 6/2005 | Hampel et al. |
| 2007/0217559 A1 | 9/2007 | Stott et al. |
| 2009/0138747 A1 | 5/2009 | Hampel et al. |
| 2010/0083028 A1 | 4/2010 | Oh |
| 2010/0135100 A1 | 6/2010 | Chiu |
| 2010/0271092 A1 | 10/2010 | Zerbe et al. |
| 2013/0208818 A1 | 8/2013 | Shaeffer et al. |

OTHER PUBLICATIONS

PCT International Preliminary Report on Patentability dated Oct. 31, 2013 (Chapter I) in International Application No. PCT/US2012/029893. 6 pages.

Yip, Wai-Yeung, et al., "System Co-Design and Co-Analysis Approach to Implementing the XDR Memory System of the Cell Broadband Engine Processor; Realizing 3.2 Gbps Data Rate per Memory Lane in Low Cost, High Volume Production," Asia and South Pacific Design Automation Conference, 2007. ASP-DAC '07, pp. 858-865, Jan. 23-26, 2007. 8 pages.

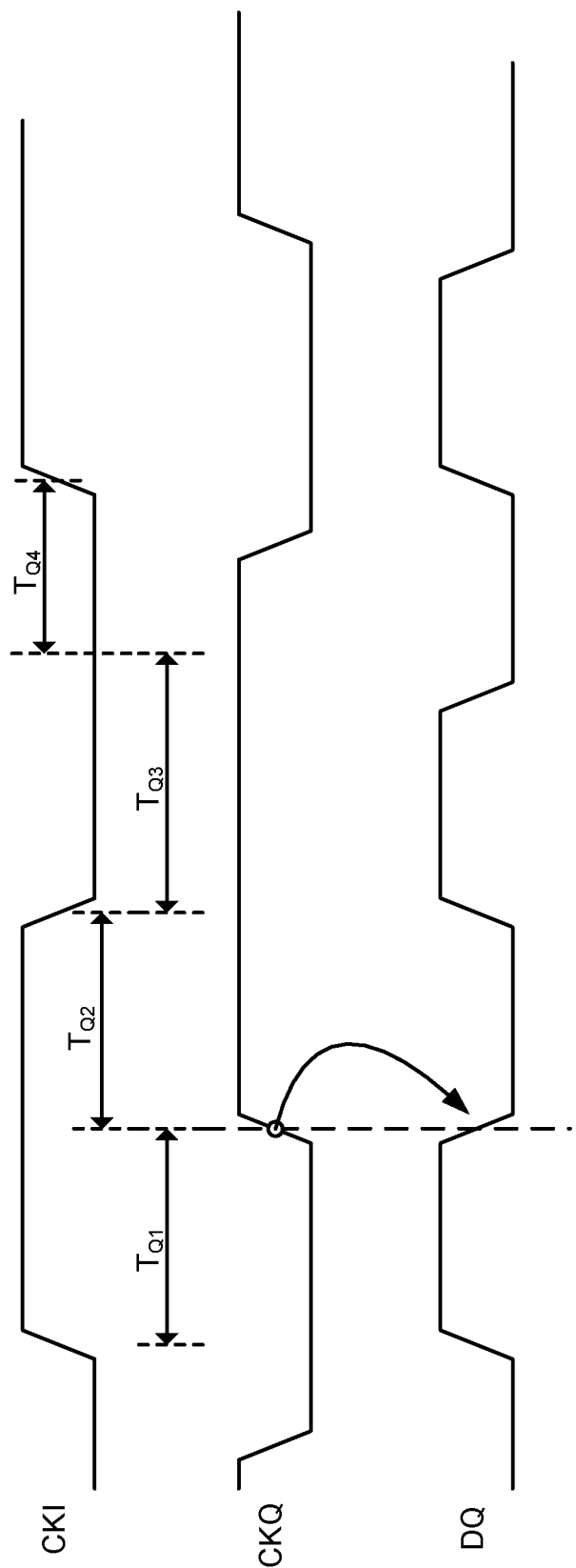

US 10,607,670 B2

MEMORY COMPONENTS AND CONTROLLERS THAT CALIBRATE MULTIPHASE SYNCHRONOUS TIMING REFERENCES

TECHNICAL FIELD

The present disclosure relates generally to information storage and retrieval and, more particularly, to calibrating the timing reference signals that time the transfer of data and/or control signals between memory system components.

BRIEF DESCRIPTION OF THE DRAWINGS

FIGS. 8A-8E are timing diagrams illustrating the calibration of timing references.

DETAILED DESCRIPTION

Figure 1:
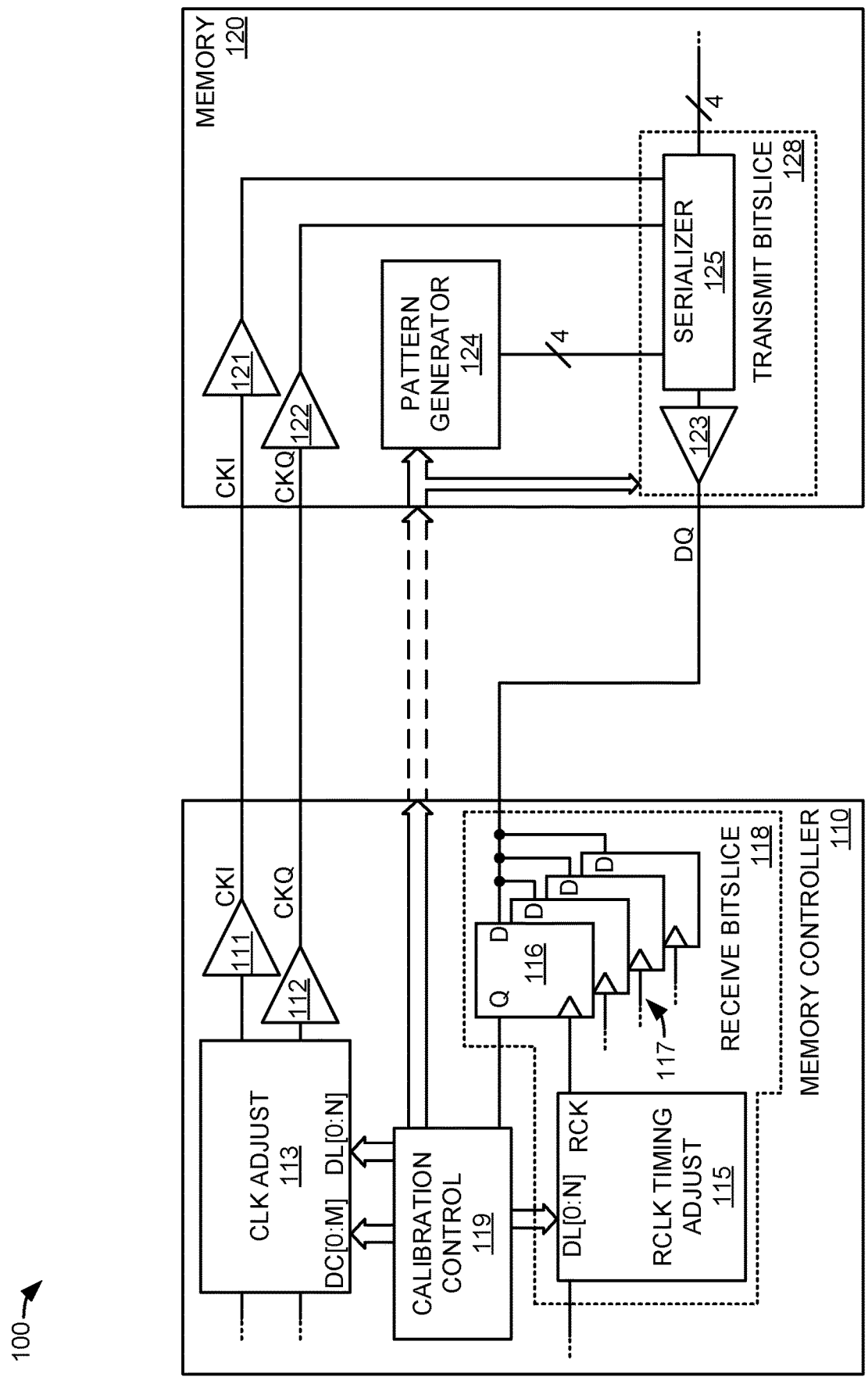
FIG. 1 is a block diagram illustrating an embodiment of a memory system.

Various embodiments described herein relate to a system including integrated circuit devices, for example, memory devices and/or at least a memory controller device that controls such memory devices (and methods of operation of these respective devices). In several embodiments, as is described in more detail below, a multiphase timing reference (e.g., quadrature clocks) is incorporated to orchestrate the transfer of data, and/or commands that specify memory operations, between memory devices and controller devices. The multiphase timing references, in various embodiments, are calibrated externally with respect to the memory devices, and within the memory devices.

In a specific embodiment, at least two timing reference signals are provided, in a system, to one or more memory devices. The timing reference signals are the same frequency, but one is delayed from the other by approximately ¼ of a cycle time of the timing reference signals. Thus, the two timing reference signals have a quadrature phase relationship or are "in quadrature." It should be understood that the conditions necessary to be approximately "in quadrature" is application dependent and does not necessarily mean exactly ¼ of a cycle. Instead, depending on the tightness of timing budgets, and other factors, a given application (or location in a system) allows for a certain range around ¼ of a cycle, as well as a certain deviation in the duty cycles of the quadrature clocks and can still be considered to be "in quadrature" or have a quadrature phase relationship.

In an embodiment, the timing reference signals are distributed to multiple memory devices in a "fly-by" topology. In a "star" or "T" topology, the signals are routed to arrive at some or all of the memory devices at substantially the same time. In a fly-by topology, signals are routed such that they arrive at a first device, then a next device (i.e., at least two memory devices) then the next, etc., in sequence or serial-like fashion. Accordingly, the flight times of these timing reference signals from the timing reference source to each of the memory devices are skewed, and thus different. In addition, because each memory device receives the signals at a different location, the skew, duty cycle distortion, and phase distortion between the two timing reference signals may be different for each memory device.

In an embodiment, distributing two lower frequency quadrature timing reference (a.k.a., one of clock or strobe) signals allows these lower frequency timing reference signals to arrive at each of the destination memory devices with more amplitude than a single timing reference signal being sent at twice the frequency. Because there are two edges for each of the two quadrature timing references per cycle, and those edges are not aligned between one timing reference signal relative to another timing reference signal, the quadrature timing references define four instants (or periods) per cycle which may be used to synchronize signals into, or out of, a memory device. A signal may be clocked in (or out) of a device by each edge of both of the timing references. Thus, distributing two timing references in quadrature enables signals to be clocked in/out of devices at four times the frequency of the individual timing reference signal, while adequate signal strength of the timing reference signals is maintained upon arriving at the devices. However, skew, duty cycle distortion, and phase distortion (a.k.a. skew) between the two timing reference signals as they are received at a memory device, or distributed within a memory device, cause these four periods to be unequal. Calibrating these timing references so that they have approximately 50% duty cycles, and a phase delay between them of approximately one-quarter of a cycle ensures that the four periods are all approximately the same length of time.

FIG. 1 is a block diagram illustrating an embodiment of a memory system. In FIG. 1, memory system 100 comprises memory controller 110 and memory 120. Memory controller 110 includes driver 111, driver 112, clock adjust 113, calibration control 119, and receive bitslice 118. Memory controller 110 also includes timing reference ports CKI and CKQ that are driven by driver 111 and driver 112, respectively. Receive bitslice 118 includes samplers 117, one of which is sampler 116, and receive clock adjust 115. Samplers 117 are for receiving signals from memory 120 via a signal port, DQ.

Memory controller 110 and memory 120 are integrated circuit type devices, such as ones commonly referred to as a "chips". A memory controller, such as memory controller 110, manages the flow of data going to and from memory devices, such as memory 120. For example, a memory controller may be a northbridge chip, an application specific integrated circuit (ASIC) device, a load-reduction memory buffer, a graphics processor unit (GPU), a system-on-chip (SoC) or an integrated circuit device that includes many circuit blocks such as ones selected from graphics cores, processor cores, and MPEG encoder/decoders, etc.

Although a single memory 120 is shown, there may be multiple memory devices or chips disposed on a memory module and coupled to the memory controller via a connector interface. Memory 120 can include a dynamic random access memory (DRAM) core or other type of memory cores, for example, static random access memory (SRAM) cores, or non-volatile memory cores such as flash. Memory controller 110 and memory 120 may be interconnected with each other in a variety of system topologies including on a PC board (e.g., where the memory is on a module and the controller is socketed to the PC board, or in "die-down" arrangement where one or both of the chips are soldered to the PC board), stacked one on top of another and encapsulated in a single package or each having separate package (package-on-package), both disposed on a shared substrate, on an interposer, or even in a direct-attach arrangement. In addition, although the embodiments presented herein describe memory controller and one or more memory devices, the instant apparatus and methods may also apply to chip interfaces that effectuate signaling between separate integrated circuit devices.

In an embodiment, the signals output by timing reference ports CKI and CKQ are periodic at a stable frequency and have an approximate quadrature phase relationship to each other. Because CKI and CKQ are periodic, CKI and CKQ may be referred to as clock signals (and thus drivers 111 and 112 may be referred to as clock drivers; receivers 121 and 122 may be referred to as clock receivers). The sent (and received) signal values on CKI and CKQ per approximately ¼ of each CKI cycle is given in Table 1. In another embodiment, the signals output by timing reference ports CKI and CKQ may be one of respective intermittent clock signals or strobe signals that maintain a quadrature relationship to each other. In this embodiment, because CKI and CKQ are strobes, drivers 111 and 112 may be referred to as strobe drivers and receivers 121 and 122 may be referred to as strobe receivers.

TABLE 1

| Part of cycle | CKI | CKQ |
| --- | --- | --- |
| $1^{st}$ quarter cycle | 0 | 0 |
| $2^{nd}$ quarter cycle | 1 | 0 |
| $3^{rd}$ quarter cycle | 1 | 1 |
| $4^{th}$ quarter cycle | 0 | 1 |

Note that each of the quarter cycles given in Table 1 involve a unique combination of CKI and CKQ. Thus, the states of CKI and CKQ, or the transitions between these states, can be used as timing references to control the transmission or reception of other signals, such as DQ, at a rate that is 4 times the cycle time of CKI and CKQ. Note further that the above example is specific to a quadrature embodiment; other embodiments are readily derived. For example, a sextile embodiment would comprise three timing signals offset in phase from each other by $\frac{1}{6}^{th}$ of a clock cycle, an octal embodiment would compress four timing signals offset by $\frac{1}{8}^{th}$ of a clock cycle, etc. For purposes of explanation, the simpler quadrature embodiment will be described herein.

Under the control of calibration control 119, receive clock timing adjust 115 adjusts at least a delay of an input clock signal to produce a timing reference signal (RCK) supplied to at least sampler 116. The adjustments to RCK at least allow the timing of the edge that triggers sampler 116 to be swept through a range of timings. The range of timing RCK may be swept at least include enough of a range that sampler 116 can sample a signal that was output by memory 120 in response to each of the four edges output on timing reference ports CKI and CKQ.

Calibration control 119 also controls a duty cycle adjust input (DC[0:M]) and a quadrature phase adjust input (DL[0:N]) of clock adjust 113. Accordingly, calibration control 119 may control the duty cycle of CKI or CKQ, and the quadrature phase delay between them. Calibration control 119 may control (or adjust) the duty cycle output by CKI or CKQ, and the quadrature phase delay between them based on the sampled values received from sampler 116.

Memory 120 includes receiver 121, receiver 122, pattern generator 124, transmit bit slice 128, serializer 125, and transmitter 123. Timing reference ports CKI and CKQ of memory controller 110 are operatively coupled to memory 120 ports CKI and CKQ, respectively. Signal port DQ of memory controller 110 is operatively coupled to signal port DQ of memory 120, respectively. Receiver 121 and receiver 122 of memory 120 receive the CKI and CKQ signals, respectively, from memory controller 110. Receiver 121 and receiver 122 of memory 120 generate internal clocks or strobes derived from the CKI and CKQ signals, respectively, received from memory controller 110. Under the control of commands operatively received from calibration control 119 (e.g., calibration commands can be sent from memory controller 110 to memory 120 via a command channel interface, not shown), transmit bit slice 128 is placed into a calibration mode. In this mode, serializer 125 responds to pattern generator 124, and ignores the normal read data path (e.g., from the memory core). In this mode, pattern generator 124 supplies a plurality of calibration data patterns, one at a time, to serializer 125 which then outputs the serial calibration data stream to transmitter 123 which sends it, via the ports of memory controller 110 and memory 120, to samplers 117, and sampler 116, in particular. In an embodiment, pattern generator 124 may supply a plurality of pre-defined calibration data patterns, one at a time, to serializer 125. The selection of the pre-defined calibration data patterns being controlled by calibration controller 119, or a state machine in memory 120 (not shown in FIG. 1). In another embodiment, pattern generator 124 may receive programmable calibration data patterns from memory controller 110 which are stored and supplied to serializer 125.

In an embodiment, memory controller 110 and memory 120, using at least the elements described previously, may form a closed-loop system for calibrating the duty cycles of CKI and CKQ, and the quadrature phase between them. The calibration control 119 controls pattern generator 124 to output a first calibration bit pattern. Calibration control 119 also controls clock adjust 113 to control CKI and CKQ to start with default duty cycles and quadrature phase adjustments. CKI and CKQ is received by receivers 121 and 122, respectively, causing serializer 125 to output the first calibration bit pattern as a serial bitstream. The serial bitstream is sent via transmitter 123 and DQ and received at the input of sampler 116. The serial bitstream output by serializer 125 is may be repeated continuously until pattern generator 124 is commanded by calibration control 119 to output a different calibration bit pattern (e.g., a different calibration pattern, or normal read data transfers).

While serializer 125 is outputting the repeating calibration bit pattern, calibration control 119 controls receive clock timing adjust 115 to sweep RCK over a range of timings that allow calibration control 119 to determine the timing of a transition between bits in the calibration pattern sent by memory 120, based on the samples taken by sampler 116. In other words, for a given timing control value (DL[0:N]) sent to RCLK timing adjust 115, sampler 116 will sample the calibration bit pattern at a given point in time. Sampling at this point in time will result in sampler 116 resolving to a logic value (i.e., a "1" or a "0") according to the point in the calibration bit pattern that is at the input of sampler 116. As RCLK is swept through a range of timings, the logic value resolving at the output of sampler 116 (and thus being sent to calibration controller 119) will change (i.e., from a "1" to a "0" or visa vice versa). The timing, or timing control value DL[0:N], at or near where this change occurs may be associated with a transition on at least one of CKI or CKQ.

Calibration controller 119 may use the various predetermined calibration bit patterns output under its control, and sweep ranges, to determine timing indicators (e.g., DL[0:N] values) associated with each of the four quadrature clock edges. It should be noted that calibration controller 119 is able to determine these timing indicators using the same receive clock adjustment circuit 115 and the same sampler 116. This helps reduce errors due to processing or circuit differences that would be present if different samplers were used to measure timing indicators associated with different edges. The timing indicators may be used to determine duty cycle adjustments (e.g., DC[0:M] values) and quadrature phase adjustments (e.g., DL[0:N]) that are sent to clock adjust 113.

It should be understood that signal port DQ of both memory controller 110 and memory 120 may correspond to any input or output pins (a.k.a., pads, or balls, etc.) of memory controller 110 or memory 120 that rely on timing reference signals communicated via timing reference ports CKI and CKQ for synchronization. For example, signal port DQ can correspond to bidirectional data pins (or pads) used to communicate read data from memory 120 to memory controller 110. Furthermore, it should be understood that the electrical signaling used by the DQ port may be either single-ended (where one signal is electrically transported with one wire) or differential (where one signal is electrically transported with two wires), utilizing whatever voltage levels are suitable for the chosen signaling type. It should also be understood that a typical memory interface has multiple DQ signal ports in parallel between memory controller 110 and memory 120; resulting distinctions between per-device and per-bit timing calibration are discussed in more detail below.

Figure 2:
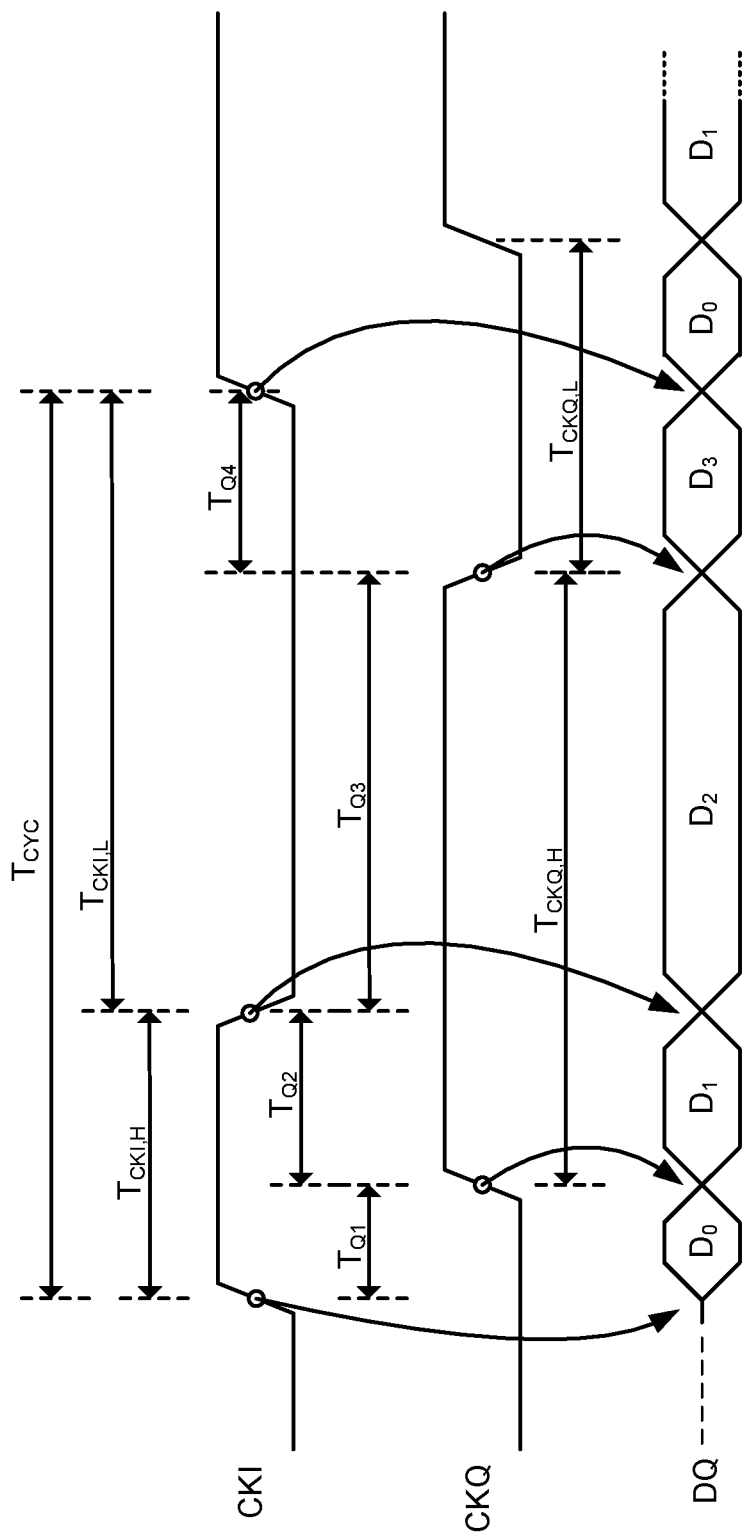
FIG. 2 is a timing diagram illustrating uncalibrated quadrature timing references used to transmit a calibration pattern.

FIG. 2 is a timing diagram illustrating uncalibrated quadrature timing references used to transmit a calibration pattern. The signals and timing illustrated in FIG. 2 may correspond to signals and timing of memory system 100 (shown in FIG. 1). In FIG. 2, CKI is shown periodically cycling with a period of $T_{CYC}$ (i.e., a frequency of $1/T_{CYC}$). CKQ is likewise shown cycling with a period of $T_{CYC}$. CKI is shown with a distorted (i.e., non 50%) duty cycle. Thus, the time that CKI is high ($T_{CKI,H}$) and the time that CKI is low ($T_{CKI,L}$) are unequal (i.e., $T_{CKI,H} \neq T_{CKI,L}$). Likewise, CKQ is shown with a distorted duty cycle. Thus, the time that CKQ is high ($T_{CKQ,H}$) and the time that CKI is low ($T_{CKQ,L}$) are unequal (i.e., $T_{CKQ,H} \neq T_{CKQ,L}$).

At the start of the timing diagram in FIG. 2, CKI and CKQ are both shown at a logic low. This corresponds to the first quarter cycle given in Table 1. A first rising edge of CKI is shown at a time when CKQ remains low. After CKI has risen, CKI is high and CKQ is low. This corresponds to the second quarter cycle shown in Table 1. The first rising edge of CKI in FIG. 2 is shown corresponding to roughly the transition to data $D_0$ on DQ. This transition corresponds to the arrival, as sent by memory controller 110, of the rising edge of CKI at serializer 125 causing the output of transmitter 123 to change.

At a time $T_{Q1}$ after the first rising edge of CKI, a first rising edge of CKQ is shown. After CKQ has risen, CKI is high and CKQ is high. This corresponds to the third quarter cycle shown in Table 1. The first rising edge of CKQ is shown corresponding to roughly the transition to data $D_1$ on DQ. This transition corresponds to the arrival, as sent by memory controller 110, of the rising edge of CKQ at serializer 125 causing the output of transmitter 123 to change.

At a time $T_{Q2}$ after the first rising edge of CKQ, a falling edge of CKI is shown. After CKI has fallen, CKI is low and CKQ is high. This corresponds to the fourth quarter cycle shown in Table 1. The falling edge of CKI is shown corresponding to roughly the transition to data $D_2$ on DQ. At a time $T_{Q3}$ after the falling edge of CKI, a falling edge of CKQ is shown. The falling edge of CKQ is shown corresponding to roughly the transition to data $D_3$ on DQ. After the falling edge of CKQ, it should be noted that both CKI and CKQ are low. This corresponds to the first quarter cycle shown in Table 1.

A second rising edge of CKI is shown at approximately $T_{Q4}$ after the falling edge of CKQ. The second rising edge of CKI is shown corresponding to roughly the transition back to data $D_0$ on DQ.

When the quadrature clocks CKI and CKQ are calibrated, the rising and falling edges of CKI and CKQ each occur approximately $T_{QUAD}$ (where $T_{QUAD}=\frac{1}{4} T_{CYC}$) apart from a rising or falling edge of the other signal. When the rising and falling edges of CKI and CKQ occur approximately $T_{QUAD}$ apart, the bit time ($T_{BIT}$) for a particular signal value (e.g., $D_0$, $D_1$, etc.) is also approximately $T_{QUAD}$. However, as shown in FIG. 2, the unequal duty cycles of CKI and CKQ, and the uncalibrated quadrature phase (i.e., $T_{Q1} \neq T_{QUAD}$) result in the bit times for the calibration pattern being unequal and/or not approximately equal to $T_{QUAD}$. By measuring when the data of the calibration pattern (i.e., $D_0$-$D_3$) arrives at sampler 116, indicators of the times $T_{Q1}$-$T_{Q4}$ may be determined. These indicators may be used by calibration control 119 to adjust the duty cycle of CKI, the duty cycle of CKQ, and the quadrature phase between them (i.e., $T_{Q1}$) until $T_{Q1}=T_{Q2}=T_{Q3}=T_{Q4}=T_{QUAD}$.

In an embodiment, the calibration patterns sent by serializer 125, and used to measure timing indicators associated with each edge of quadrature clock CKI and CKQ, (from which $T_{Q1}$-$T_{Q4}$ may be derived) involve having only one bit of the calibration pattern have having a first logic value, and the rest have having a second logic value. This one bit is rotated through each of the bits of the calibration pattern. This set of calibration patterns is given in Table 2.

TABLE 2

| Pattern # | $D_0$ | $D_1$ | $D_2$ | $D_3$ |
|---|---|---|---|---|
| 1 | 1 | 0 | 0 | 0 |
| 2 | 0 | 1 | 0 | 0 |

TABLE 2-continued

| Pattern # | $D_0$ | $D_1$ | $D_2$ | $D_3$ |
|---|---|---|---|---|
| 3 | 0 | 0 | 1 | 0 |
| 4 | 0 | 0 | 0 | 1 |

Figure 3:
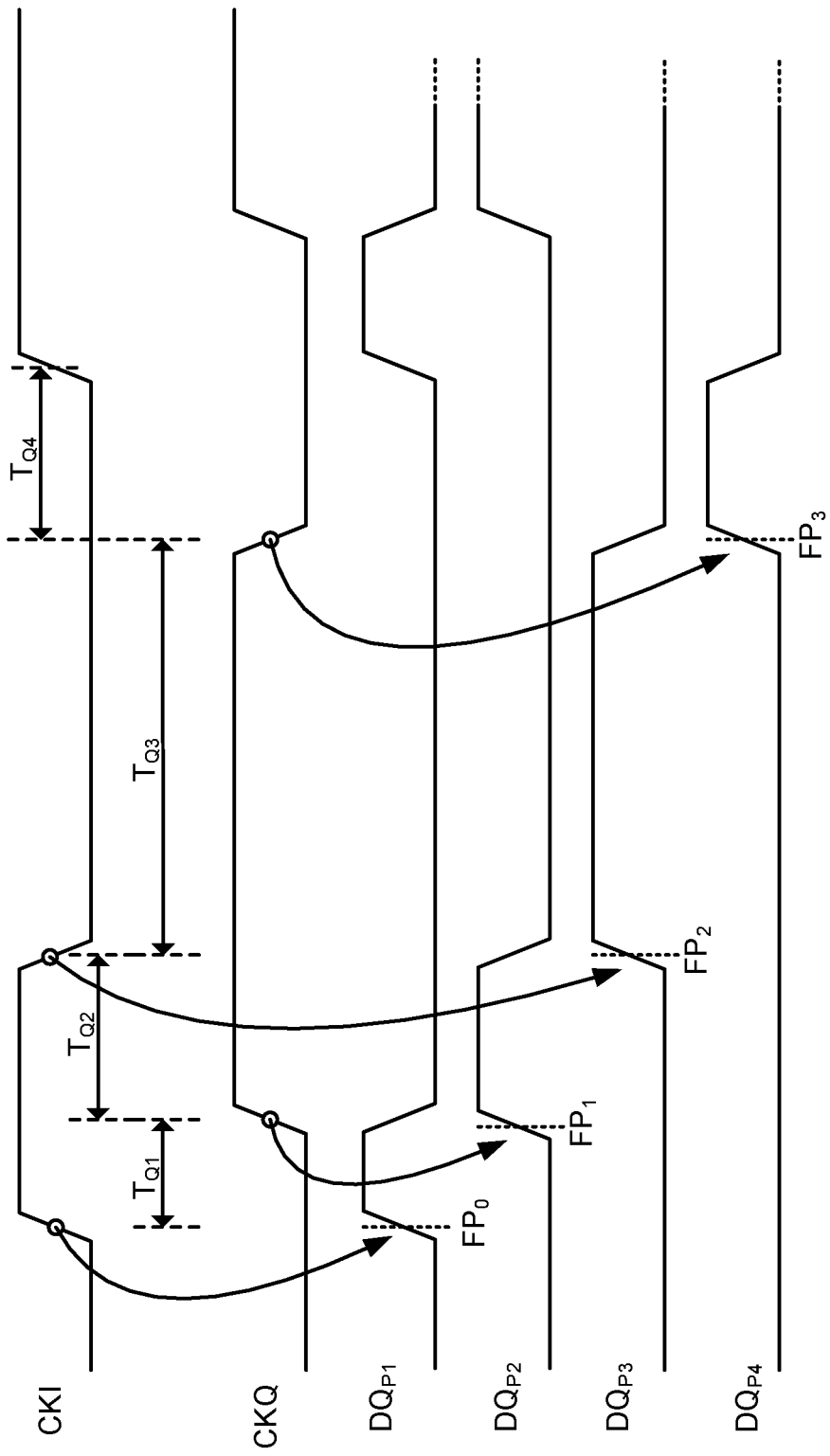
FIG. 3 is a timing diagram illustrating when transitions between bits of calibration patterns are received.

FIG. 3 is a timing diagram illustrating when transitions between bits of calibration patterns are received. FIG. 3 also illustrates the patterns given in Table 2. As can be seen in FIG. 3, each calibration pattern given in Table 2 is used to determine a timing indicator ($FP_0$-$FP_3$) each associated with an edge of either CKI or CKQ. As discussed previously, calibration control 119 may determine timing indicators $FP_0$-$FP_3$ by sweeping the timing of sampler 116's clock input to determine which values input to receive clock timing adjust 115 are close to, but on either side of, the transition between bits of the calibration pattern. Since each calibration pattern shown in Table 2 has only one bit in the pattern in a first state, (i.e., 1) and the rest in the second state (i.e., 0), each calibration pattern can be used to determine a timing indicator associated with one edge of CKI or CKQ.

Figure 4:
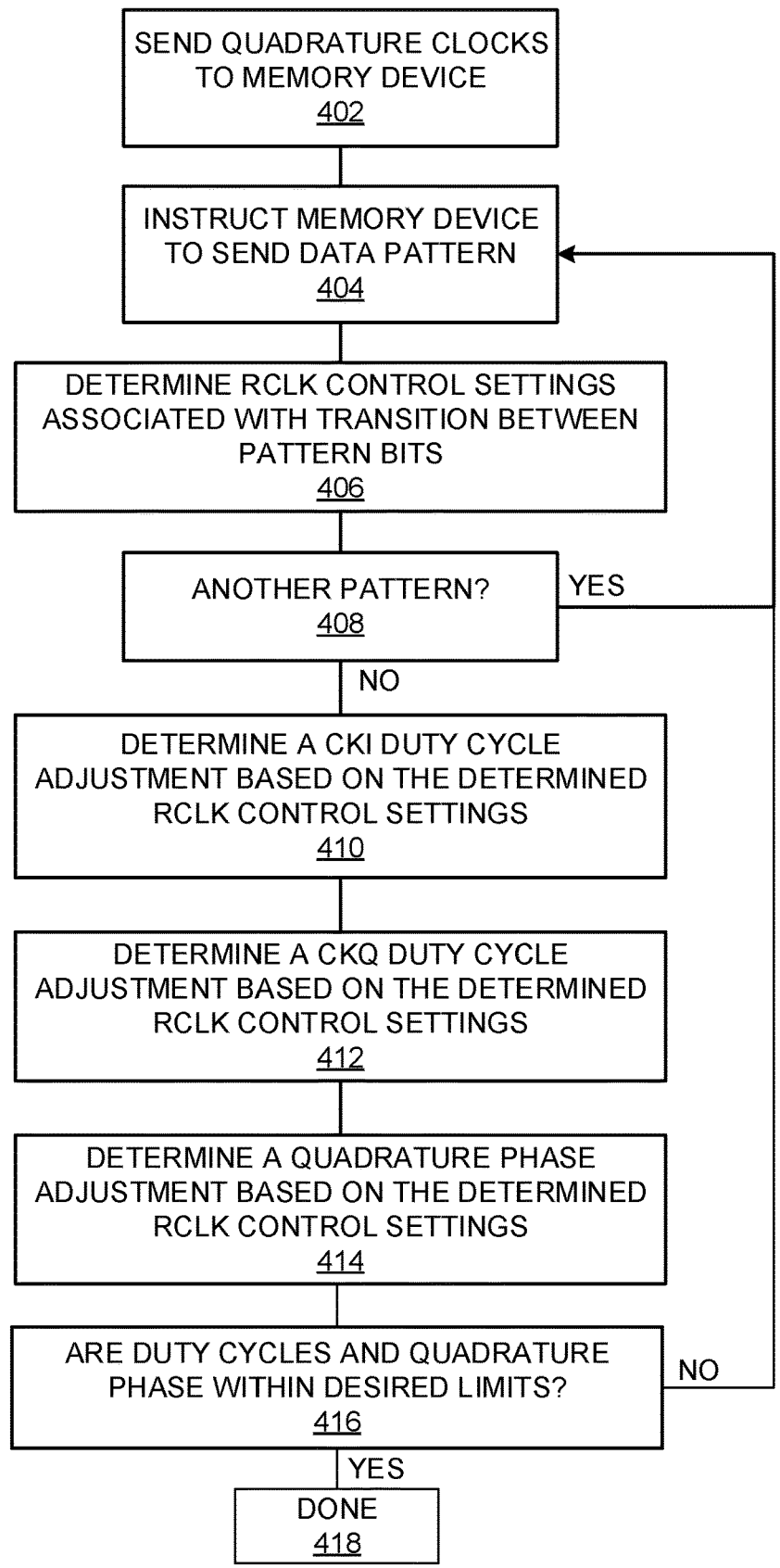
FIG. 4 is a flowchart illustrating a method of calibrating.

FIG. 4 is a flowchart illustrating a method of calibrating. The steps illustrated in FIG. 4 may be performed by one or more elements of memory system 100. In the first step of the flowchart, quadrature clocks are sent to a memory device (402). For example memory controller 110 may send CKI and CKQ quadrature clocks to memory device 120. Calibration controller 119 may set the inputs to clock adjust circuit 113 so that the duty cycle of CKI, the duty cycle of CKQ, and the quadrature phase are not calibrated (i.e., at least one of $T_{Q1}$, $T_{Q2}$, $T_{Q3}$, or $T_{Q4}$ is not approximately equal to $T_{QUAD}$).

In the second step of the flowchart, a memory device is instructed to send a data pattern (404). For example, calibration controller 119 may send a command to, or set a register value in, memory 120 that causes pattern generator 124 and serializer 125 to output a serial calibration pattern on DQ. This serial calibration pattern may be received by memory controller 110. In the next step, a receive clock control setting associated with a transition between bits is determined (406). For example, calibration controller 119 may sweep the control settings of receive clock timing adjust 115 to determine which setting is associated with a transition between bits of the calibration pattern sent by memory 120. A control setting of receive clock timing adjust circuit corresponds to a particular timing of the receive clock. Thus, a control setting of receive clock timing adjust 115 may be used as a timing indicator. The transition associated with the timing indicator determined in block 406 may depend on the data pattern sent by memory 120. For example, to determine receive clock control setting $FP_0$, data pattern #1 may be sent and with its leading-edge transition associated with the rising edge of CKI, as illustrated in FIG. 3. Similarly, to determine receive clock control setting $FP_1$, data pattern #2 may be sent and with its leading-edge transition associated with the rising edge of CKQ, as illustrated in FIG. 3.

Flow proceeds to block 404 if there is another data pattern needed to determine at least one more timing indicator. Flow proceeds to block 410 if all of the data patterns needed in order to determine enough timing indicators to perform the calibration have been sent (408). A CKI duty cycle adjustment is determined based on the determined receive clock control settings (410). For example, the difference between receive clock control setting FP0, (which is associated with the rising edge of CKI), and receive clock control setting FP2 (which is associated with the falling edge of CKI) may be used to determine a duty cycle adjustment to be applied by clock adjust 113.

In the next step of the flowchart, a CKQ duty cycle adjustment is determined based on the determined receive clock control settings (412). For example, the difference between receive clock control setting FP1, (which is associated with the rising edge of CKQ), and receive clock control setting FP3 (which is associated with the falling edge of CKQ) may be used to determine a duty cycle adjustment to be applied by clock adjust 113. Finally, a quadrature phase adjustment is determined based on the determined receive clock control settings (414). For example, the difference between receive clock control setting FP0, (which is associated with the rising edge of CKI), and receive clock control setting FP1 (which is associated with the rising edge of CKQ) may be used to determine a quadrature phase adjustment to be applied by clock adjust 113. Duty cycles and quadrature phase are checked to determine if they are within desired limits or ranges (416). If any of the duty cycles or the quadrature phase are not within desired limits, flow proceeds back to box 404 for further adjustment of the quadrature phase and/or duty cycles. If all of the duty cycles and the quadrature phase are within the desired limits, flow terminates in box 418.

Figure 5:
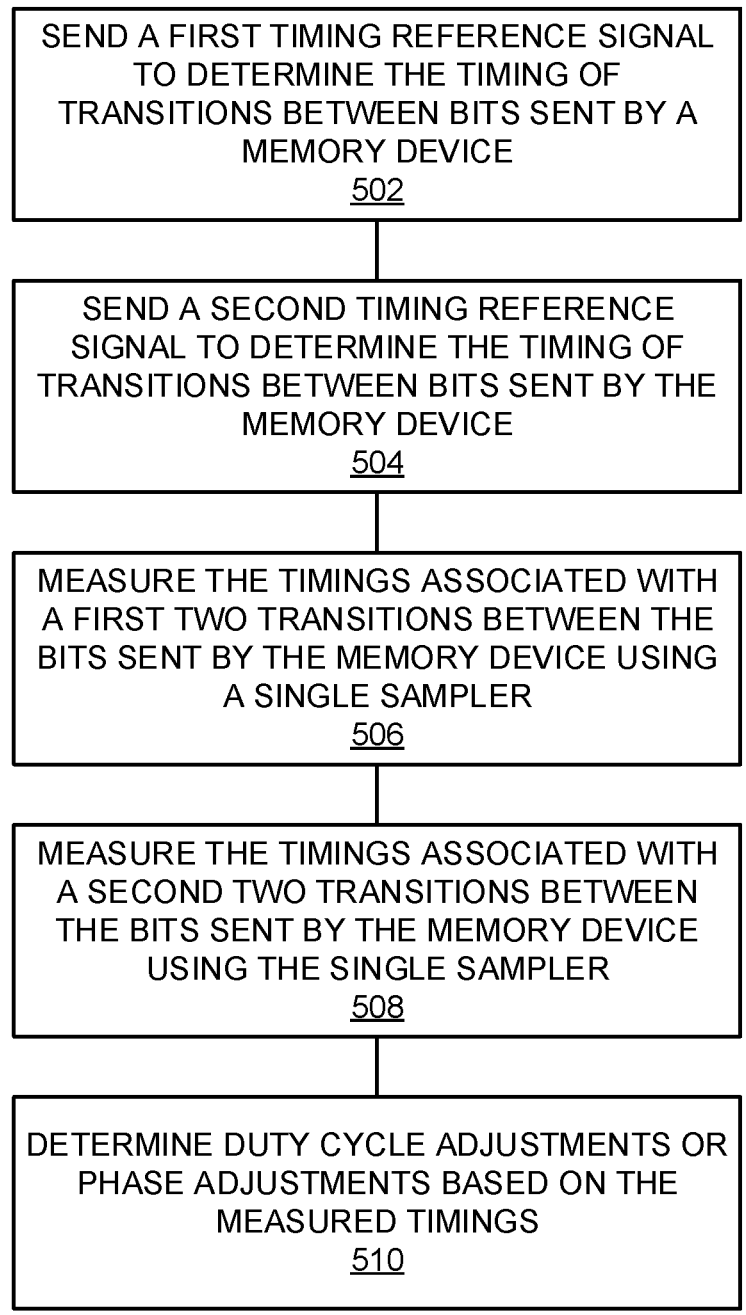
FIG. 5 is a flowchart illustrating a method of determining timing adjustments.

FIG. 5 is a flowchart illustrating a method of determining timing adjustments. The steps illustrated in FIG. 5 may be performed by one or more elements of memory system 100. In the first step, a first timing reference signal is sent to determine the timing of transitions between bits sent by a memory device (502). For example, memory controller 110 may send CKI to memory 120. Memory 120 may use the CKI signal to clock serializer 125. Next, a second timing reference signal is sent to determine the timing of transitions between bits sent by a memory device (504). For example, memory control 110 may send CKQ to memory 120. Memory 120 may use the CKQ signal to clock serializer 125.

In the next step of the flowchart, the timings associated with a first two transitions between the bits sent by the memory device are measured using a single sampler (506). For example, memory controller 110 may measure the timing associated with the rising edge transition between bits of pattern #1 and pattern #3 of Table 2, as sent by memory 120 in response to transitions on CKI. These timings can be associated with the rising and falling edges, respectively, of CKI. The timings associated with a second two transitions between the bits sent by the memory device a measured using the single sampler (508). For example, memory controller 110 may measure the timing associated with the rising edge transition between bits of pattern #2 and pattern #4 of Table 2, as sent by memory 120 in response to transitions on CKQ. These timings can be associated with the rising and falling edges, respectively, of CKQ.

Finally, duty cycle adjustments or phase adjustments are determined based on the measured timings (510). For example, the first two measurements may be used to determine the current duty cycle of CKI. Once the current duty cycle is known, adjustments may be sent to clock adjust 113 which equalize the amount of time CKI is high ($T_{CKI,H}$) and low ($T_{CKI,L}$). In another example, the second two measurements may be used to determine the current duty cycle of CKQ. Once the current duty cycle is known, adjustments may be sent to clock adjust 113 which equalize the amount of time CKQ is high ($T_{CKQ,H}$) and low ($T_{CKQ,L}$). In another example, one of the first two measurements and one of the second two measurements may be used to determine the quadrature phase between CKI and CKQ. These two selected measurements should correspond to the same edge of CKI and CKQ. In other words, the edges selected should correspond to the rising edge of CKI and the rising edge of CKQ, or the falling edge of CKI and the falling edge of CKQ. Once the current quadrature phase is known, adjustments may be sent to clock adjust 113 which equalize the amount of time CKI and CKQ are in each of four phases (i.e., $T_{Q1}=T_{Q2}=T_{Q3}=T_{Q4}=T_{QUAD}$).

Figure 6:
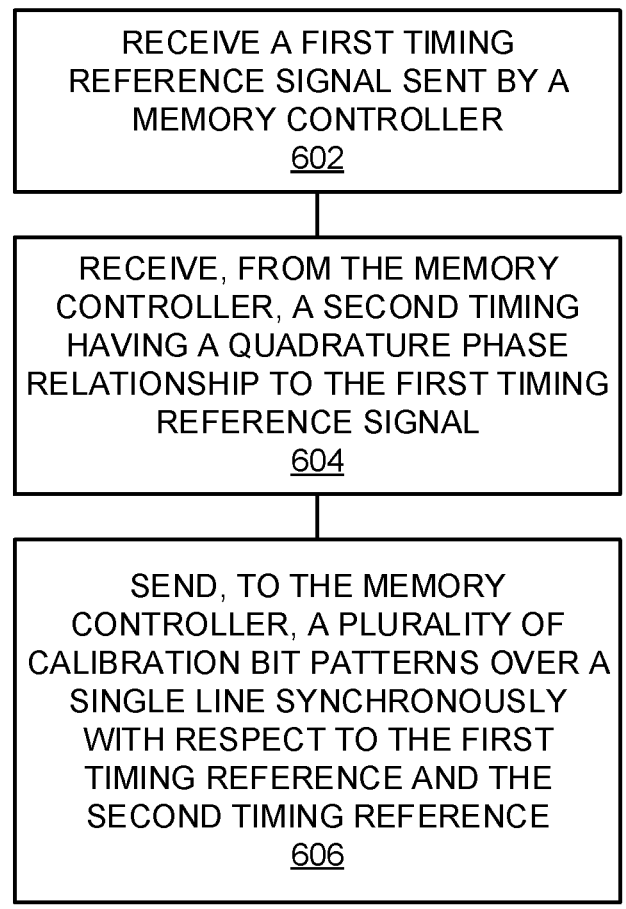
FIG. 6 is a flowchart illustrating a method of operating a memory device.

FIG. 6 is a flowchart illustrating a method of operating a memory device. The steps illustrated in FIG. 6 may be performed by one or more elements of memory system 100. In the first step of this flowchart, a first timing reference signal, sent by a memory controller, is received (602). For example, memory 120 may receive CKI from memory controller 120. In the second step, a second timing reference signal, having a quadrature phase relationship to the first timing reference signal, is received from the memory controller (604). For example, memory 120 may receive CKQ from memory controller 110.

In the last step of the flowchart, a plurality of calibration bit patterns are sent to the memory controller over a single line synchronously with respect to the first timing reference and the second timing reference (606). For example, calibration controller 119 may instruct pattern generator 124 to output a plurality of bit patterns to serializer 125. Serializer 125 outputs a serial data stream of the bit patterns synchronously with respect to transitions on CKI and CKQ. The output of serializer 125 is carried to memory controller 110 (and sampler 116, in particular) via a single line, DQ.

Figure 7A:
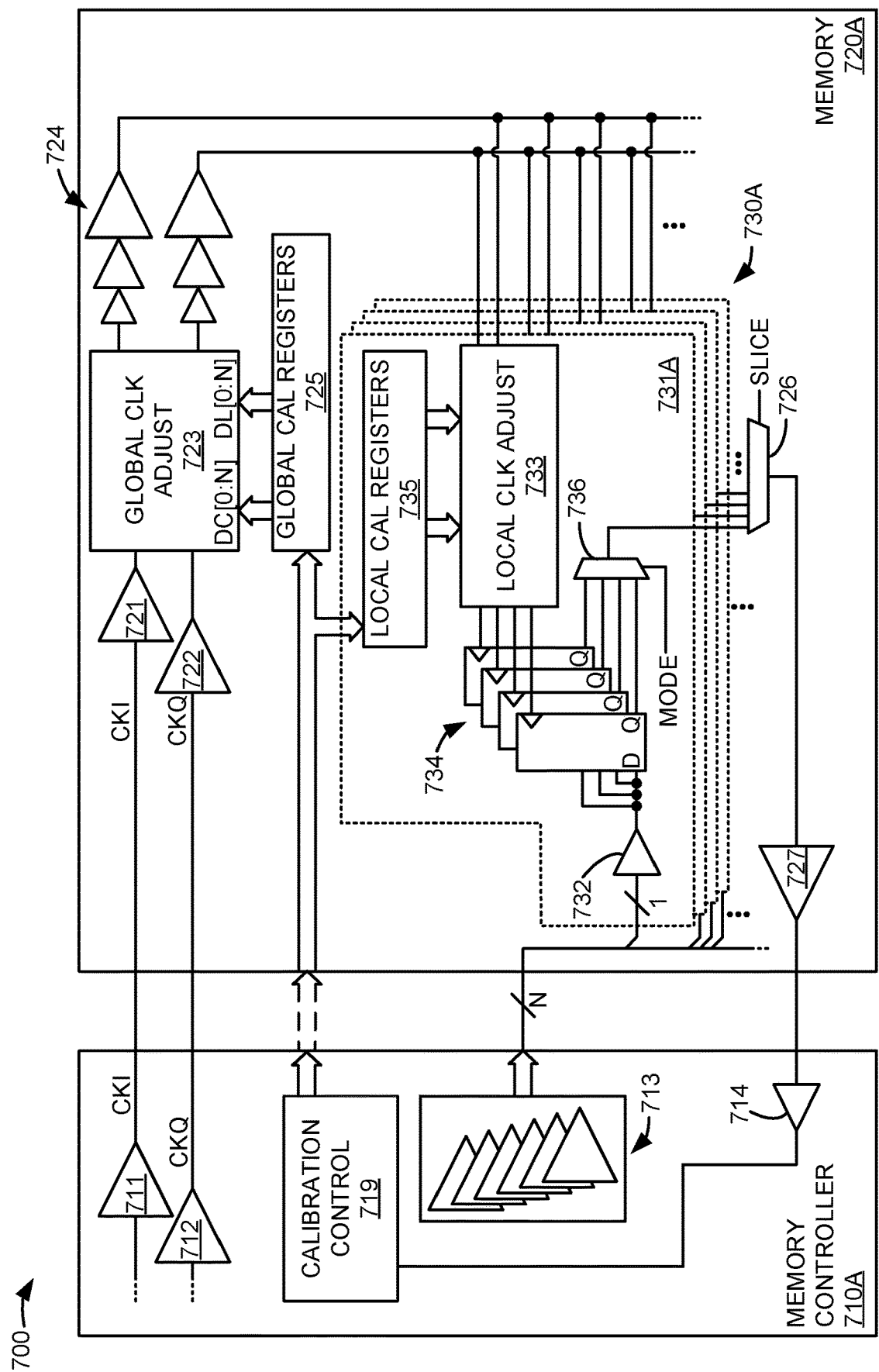
FIGS. 7A and 7B are block diagrams illustrating embodiments of a memory system.

FIG. 7A is a block diagram illustrating an embodiment of a memory system. In FIG. 7A, memory system 700 comprises memory controller 710A and memory 720A. Memory controller 710A includes driver 711, driver 712, calibration control 719, drivers 713, and receiver 714. Memory controller 710A also includes timing reference ports CKI and CKQ that are driven by driver 711 and driver 712, respectively.

Memory controller 710A and memory 720A are integrated circuit type devices, such as one commonly referred to as a "chip". A memory controller, such as memory controller 710A, manages the flow of data going to and from memory devices, such as memory 720A. For example, a memory controller may be a northbridge chip, an application specific integrated circuit (ASIC) device, a graphics processor unit (GPU), a system-on-chip (SoC), a memory buffer, or an integrated circuit device that includes many circuit blocks such as ones selected from graphics cores, processor cores, and MPEG encoder/decoders, etc. Memory 720A can include a dynamic random access memory (DRAM) core or other type of memory cores, for example, static random access memory (SRAM) cores, or non-volatile memory cores such as flash. In addition although the embodiments presented herein describe memory controller and components, the instant apparatus and methods may also apply to chip interfaces that effectuate signaling between separate integrated circuit devices.

In an embodiment, the signals output by timing reference ports CKI and CKQ are periodic at a stable frequency and have an approximate quadrature phase relationship to each other. Memory 720A includes receiver 721, receiver 722, global clock adjust 723, internal clock distribution 724, global calibration registers 725, multiplexer (MUX) 726, driver 727, and receive bitslices 730A. Bitslice 731A is an example of one of the receive bitslices 730A. Bitslice 731A comprises receiver 732, samplers 734, local clock adjust 733, local calibration registers 735, and multiplexer 736. Timing reference ports CKI and CKQ of memory controller 710A are operatively coupled to memory 720A ports CKI and CKQ, respectively. Drivers 713 of memory controller 710A are operatively coupled to bitslices 730A. Receiver 721 and receiver 722 of memory 720A receive the CKI and CKQ signals, respectively, from memory controller 710A. Receiver 721 and receiver 722 of memory 720A are operatively coupled to global clock adjust 723. Global clock adjust 723 outputs adjusted CKI and CKQ signals which are distributed internally to memory 720A, and to bitslices 730A in particular, by internal clock distribution 724.

Under the control of commands received from calibration control 719, global calibration registers 725 control global clock adjust 723 to make duty cycle adjustments and quadrature phase adjustments of CKI and CKQ before they are distributed by internal clock distribution 724. Also under the control of commands received from calibration control 719, local calibration registers 735 control local clock adjust to make duty cycle adjustments and quadrature phase adjustments of CKI and CKQ local to bitslice 731A before they are used by samplers 734. Global calibration registers may also control the input selected by multiplexer 736. The input selected by multiplexer 736 determines which of samplers 734 is sent to multiplexer 726. Multiplexer 726 sequentially selects which bitslice 730A is sending a data bit from its samplers 734 to calibration control 719 via driver 727 and receiver 714. Accordingly, values driven by drivers 713 are sampled by the samplers 734 of bitslices 730A and may be sent back to calibration control 719.

In an embodiment, memory controller 710A and memory 720A, using at least the elements described previously, may form a closed-loop system for calibrating the duty cycles of CKI and CKQ, and the quadrature phase between them internal to bitslices 730A. The calibration control 719 controls drivers 713 to output a calibration bit pattern. The calibration bit is received at the input of samplers 734. The outputs of samplers 734 may be sent through MUX 736, MUX 726, and driver 727 to calibration control 719. Accordingly, the received values of the calibration bit pattern, with receive timing determined by CKI and CKQ internal to bitslices 731A which were adjusted by global clock adjust 723 and local clock adjust 733, may be sent back to calibration control 719. Calibration control 719 may used these received versions to make changes to global calibration registers 725 and local calibration registers 735.

Figure 7B:
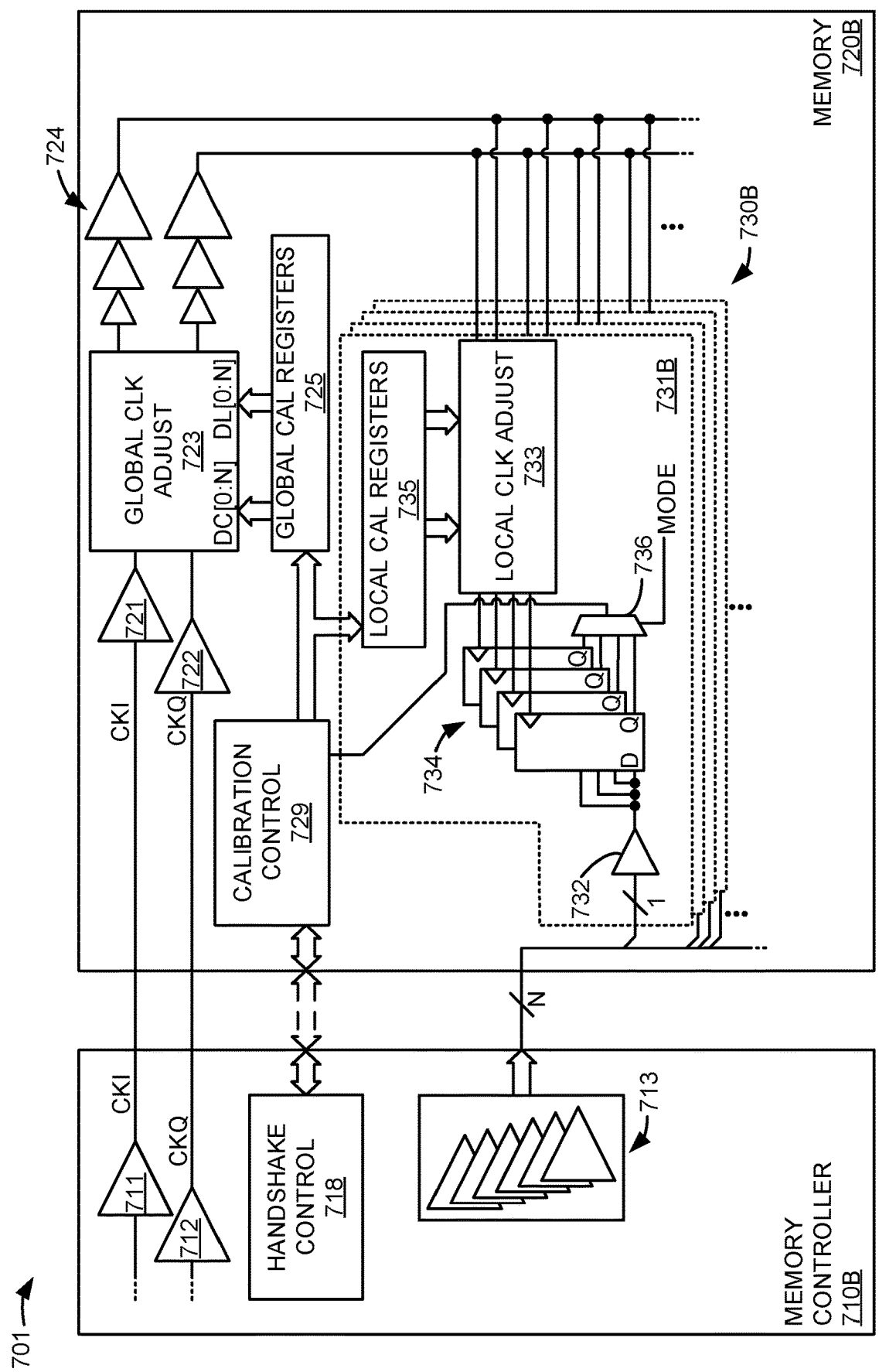

FIG. 7B is a block diagram illustrating an embodiment of a memory system. In FIG. 7B, memory system 701 comprises memory controller 710B and memory 720B. Memory controller 710B includes driver 711, driver 712, handshake control 718, and drivers 713. Memory controller 710B also includes timing reference ports CKI and CKQ that are driven by driver 711 and driver 712, respectively. Thus, it should be understood that memory system 701 is similar to memory system 700 of FIG. 7A. A difference between memory system 700 and memory system 701 is that, for memory system 701, calibration control 729 is included in memory 720B whereas, for memory system 700, calibration control 719 is included in memory controller 710A.

Memory controller 710B and memory 720B are integrated circuit type devices, such as one commonly referred to as a "chip". A memory controller, such as memory controller 710B, manages the flow of data going to and from memory devices, such as memory 720B. For example, a memory controller may be a northbridge chip, an application specific integrated circuit (ASIC) device, a graphics processor unit (GPU), a system-on-chip (SoC), a memory buffer, or an integrated circuit device that includes many circuit blocks such as ones selected from graphics cores, processor cores, and MPEG encoder/decoders, etc. Memory 720B can include a dynamic random access memory (DRAM) core or other type of memory cores, for example, static random access memory (SRAM) cores, or non-volatile memory cores such as flash. In addition although the embodiments presented herein describe memory controller and components, the instant apparatus and methods may also apply to chip interfaces that effectuate signaling between separate integrated circuit devices.

In an embodiment, the signals output by timing reference ports CKI and CKQ are periodic at a stable frequency and have an approximate quadrature phase relationship to each other. Memory 720B includes receiver 721, receiver 722, global clock adjust 723, internal clock distribution 724, global calibration registers 725, and receive bitslices 730B. Bitslice 731B is an example of one of the receive bitslices 730B. Bitslice 731B comprises receiver 732, samplers 734, local clock adjust 733, local calibration registers 735, and multiplexer 736. Timing reference ports CKI and CKQ of memory controller 710B are operatively coupled to memory 720B ports CKI and CKQ, respectively. Drivers 713 of memory controller 710B are operatively coupled to bitslices 730B. Receiver 721 and receiver 722 of memory 720B receive the CKI and CKQ signals, respectively, from memory controller 710B. Receiver 721 and receiver 722 of memory 720B are operatively coupled to global clock adjust 723. Global clock adjust 723 outputs adjusted CKI and CKQ signals which are distributed internally to memory 720B, and to bitslices 730B in particular, by internal clock distribution 724.

In response to handshaking or control signals from handshake control 718, calibration control 729 makes duty cycle adjustments and quadrature phase adjustment of CKI and CKQ before they are distributed by internal clock distribution 724, and local to each of bitslices 730B. In one embodiment, handshaking may comprise a mode register set (MRS) command sent by memory controller 710B to memory 720B. The MRS command may configure memory 720B to be in a clock calibration mode. In some embodiments, the clock calibration mode may be specified to be complete after a certain time limit has passed. When this time limit has passed, another MRS command may configure memory 720B to exit the clock calibration mode. In other embodiments, memory 720B may exit the clock calibration mode once calibration is satisfactorily completed. Memory 720B may also exit clock calibration mode after indicating on a signal to memory controller 710B that calibration is complete. Calibration control 729, global calibration registers 725 control global clock adjust 723 to make global duty cycle adjustments and quadrature phase adjustments of CKI and CKQ before they are distributed by internal clock distribution 724. Also under the control of commands received from calibration control 729, local calibration registers 735 control local clock adjust to make duty cycle adjustments and quadrature phase adjustments of CKI and CKQ local to bitslice 731B before they are used by samplers 734. Global calibration registers may also control the input selected by multiplexer 736. The input selected by multiplexer 736 determines which of samplers 734 are sent to calibration control 729. Accordingly, values driven by drivers 713 are sampled by the samplers 734 of bitslices 730B and may be sent to calibration control 729.

In an embodiment, the elements of memory controller 710B, using at least the elements described previously, may form a closed-loop system for calibrating the duty cycles of CKI and CKQ, and the quadrature phase between them internal to bitslices 730B. Memory 710B controls drivers 713 to output a calibration bit pattern and calibration control 729 to begin a calibration process. The calibration bit pattern is received at the input of samplers 734. The outputs of samplers 734 may be sent through MUX 736 to calibration control 729. Accordingly, the received values of the calibration bit pattern, with receive timing determined by CKI and CKQ internal to bitslices 731B which were adjusted by global clock adjust 723 and local clock adjust 733, may be sent back to calibration control 729. Calibration control 729 may use these received versions to make changes to global calibration registers 725 and local calibration registers 735.

Figure 8A:
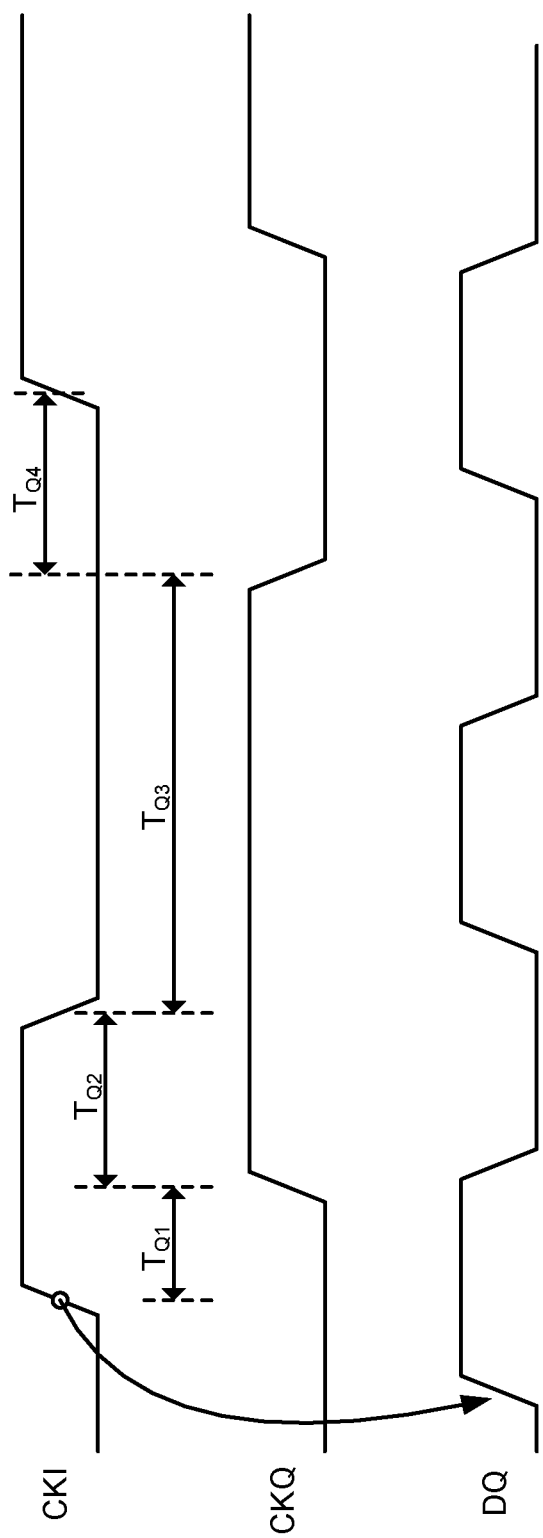
Figure 8B:
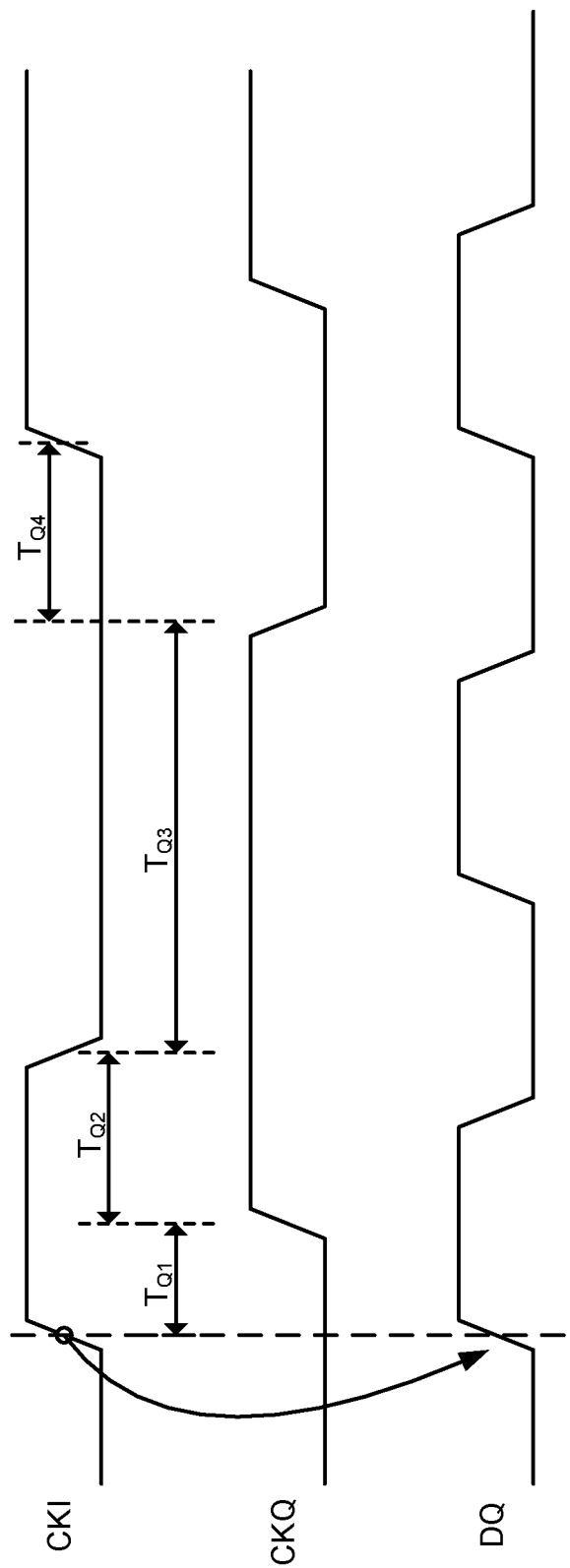

FIGS. 8A-8E are timing diagrams illustrating the calibration of timing references. In FIG. 8A, CKI and CKQ are uncalibrated. In other words, at least one of $T_{Q1}$, $T_{Q2}$, $T_{Q3}$, or $T_{Q4}$ are not approximately equal. In addition, for example, memory controller 710A is driving a toggling bit pattern to bitslice 731A at the full data rate. However, initially the rising edge of CKI is not aligned to the rising edge of the toggling bit pattern. Memory controller 710A performs write levelization in order to align the rising edge of CKI with the rising edge of the bit pattern. Write levelization is performed by memory controller 710A by varying data timing driven by drivers 713 relative to CKI driven by driver 711. This is illustrated in FIG. 8B.

Figure 8C:
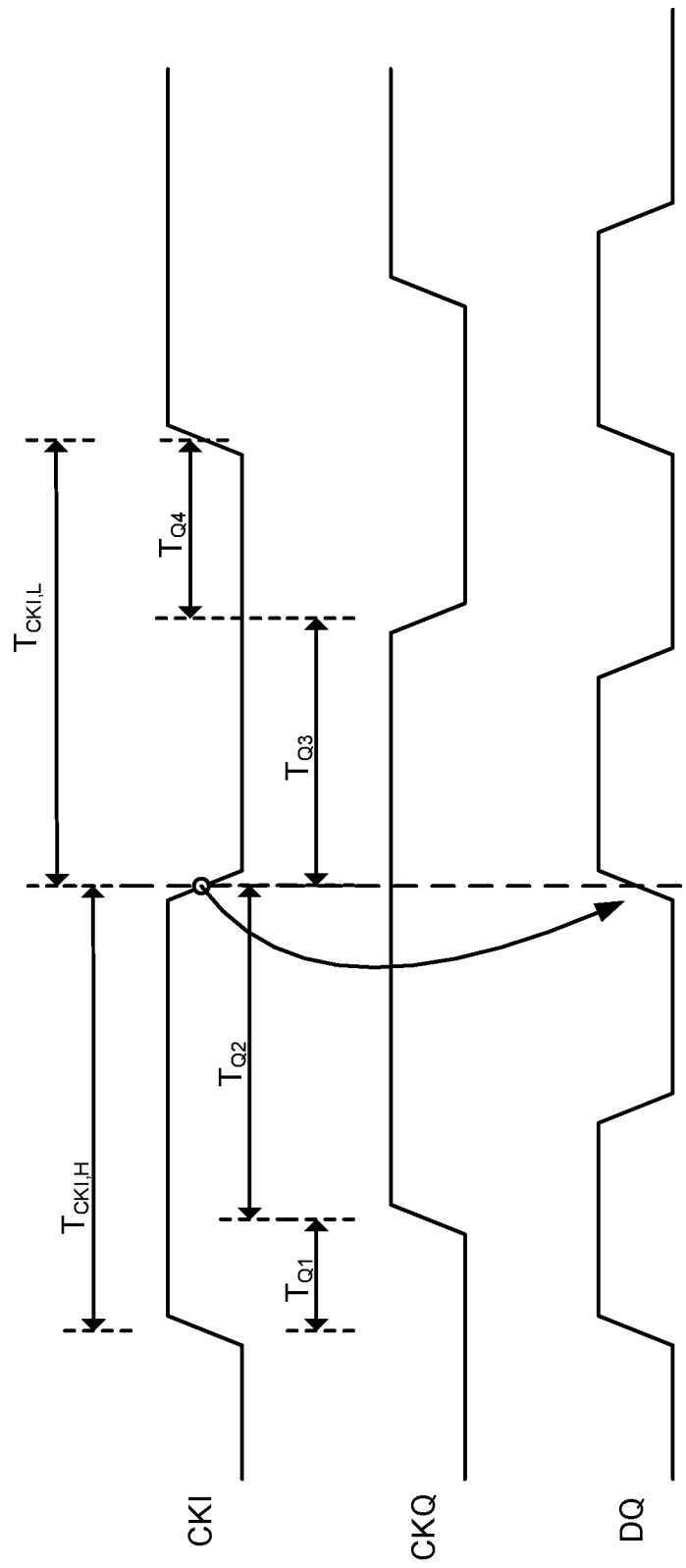

After write levelization, memory controller 710A, based on values received from samplers 734, adjusts the duty cycle of CKI by writing values to global calibration registers 725 and local calibration registers 735. The adjustment to CKI is shown in FIG. 8C where $T_{CKI,H}$ and $T_{CKI,L}$ have been adjusted to be approximately equal. Calibration control 719 may determine the adjustment to CKI by sweeping the timing of CKI and examining the results captured by the sampler 734 that is associated with the falling edge of CKI. This adjustment may be applied by calibration control 719 writing values to local calibration registers 735 and/or global calibration registers 725. These adjustments may be performed iteratively until the duty cycles and/or quadrature phase is within a desired range.

After memory controller 710A adjusts the duty cycle of CKI, memory controller 710A adjusts the quadrature phase between CKI and CKQ. The adjustment to the quadrature phase between CKI and CKQ is shown in FIG. 8D where $T_{Q1}$ and $T_{Q2}$ have been adjusted to be approximately equal. Calibration control 719 may determine the adjustment to the quadrature phase between CKI and CKQ by sweeping the timing of CKQ and examining the results captured by the sampler 734 that is associated with the rising edge of CKQ. This adjustment may be applied by calibration control 719 writing values to local calibration registers 735 and/or global calibration registers 725.

Figure 8E:
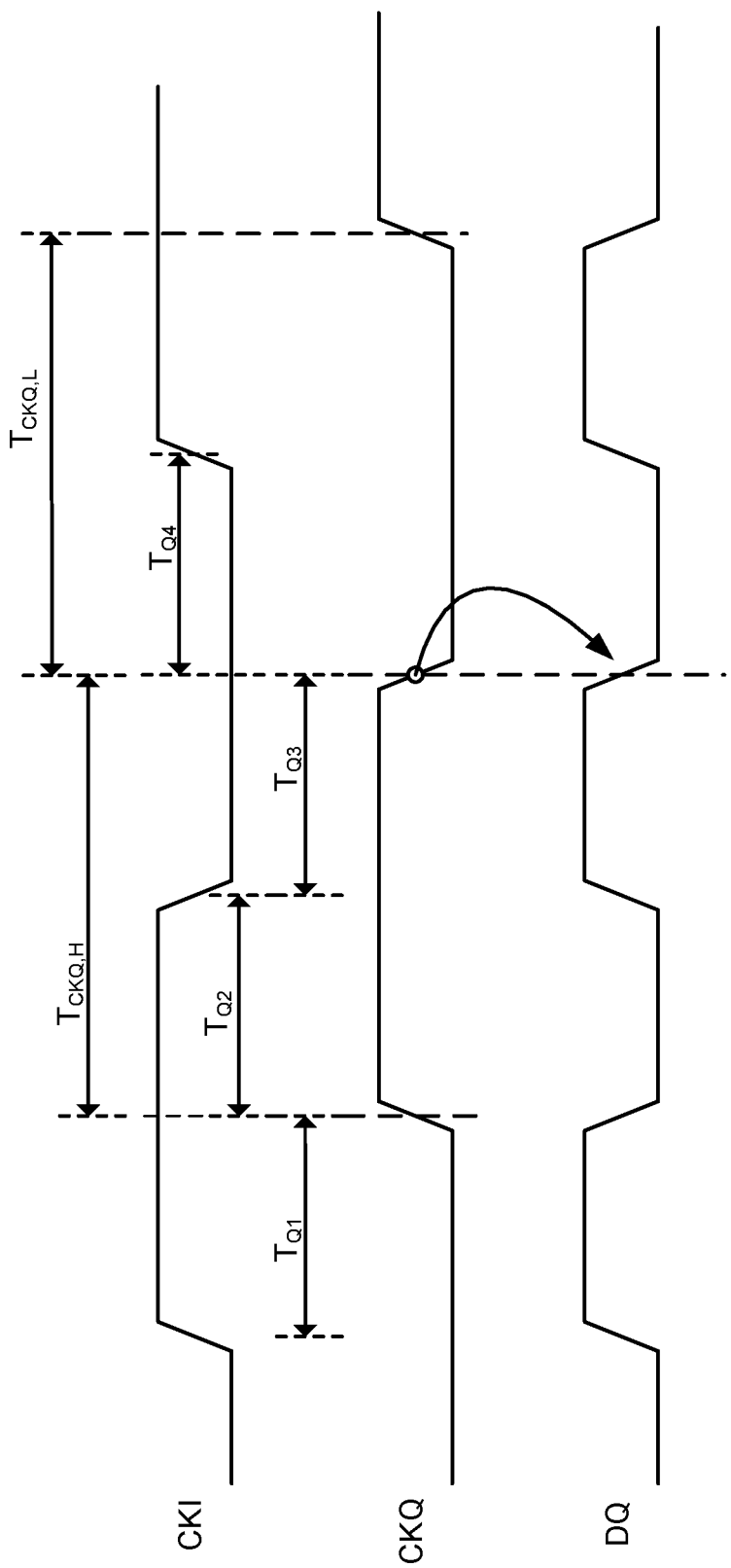

After memory controller 710A adjusts the quadrature phase between CKI and CKQ, memory controller 710A adjusts the duty cycle of CKQ. The adjustment to the duty cycle of CKQ is shown in FIG. 8E where $T_{CKQ,H}$ and $T_{CKQ,L}$ have been adjusted to be approximately equal and thereby $T_{Q1}$, $T_{Q2}$, $T_{Q3}$, and $T_{Q4}$ have been adjusted to be approximately equal. Calibration control 719 may determine the adjustment to the quadrature phase between CKI and CKQ by sweeping the timing of CKQ and examining the results captured by the sampler 734 that is associated with the falling edge of CKQ. This adjustment may be applied by calibration control 719 writing values to local calibration registers 735 and/or global calibration registers 725.

Figure 9A:
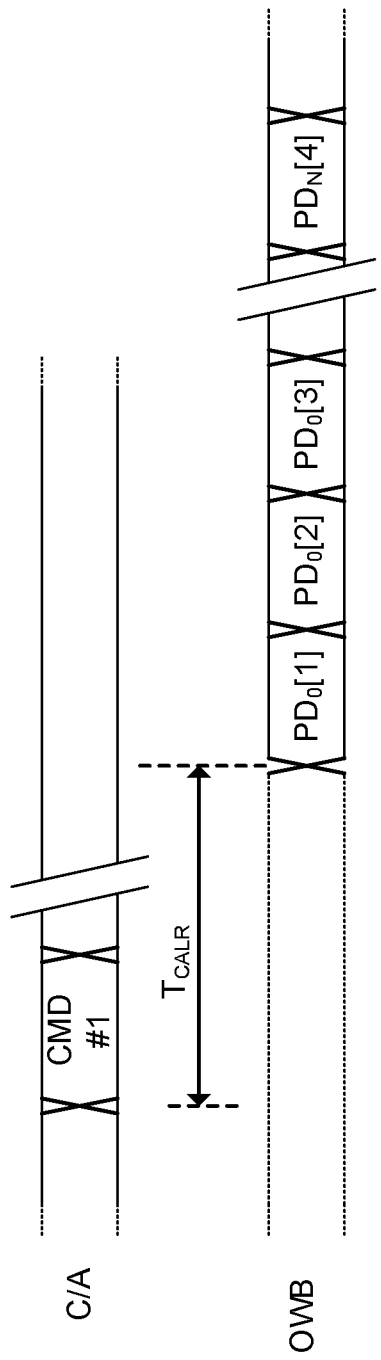
FIG. 9A is a timing diagram illustrating a transmission of sampled signal values.

FIG. 9A is a timing diagram illustrating a transmission of sampled signal values. In an embodiment, memory controller 710A sends a command to memory 720A that instructs memory 720A to send one or more values sampled by sampler 734 to memory controller 710A. Since bitslices 730A are receiving the toggling calibration data pattern, memory 720A sends the sampled values to memory controller 710A using a signal line that is, in normal operation, a one-way bit (OWB). This is illustrated in FIG. 9 by CMD #1 being sent by memory controller 710A on a command/address bus. Then, after a predetermined length of time (or clock cycles), $T_{CALR}$, memory 720A drives the values captured by samplers 734 on the one-way bit via driver 727. In an embodiment, the one-way bit may be, or be associated with, an error detection and correction (EDC) pin, Data Bus Inversion (DBI), or Data Mask (DM).

Figure 9B:
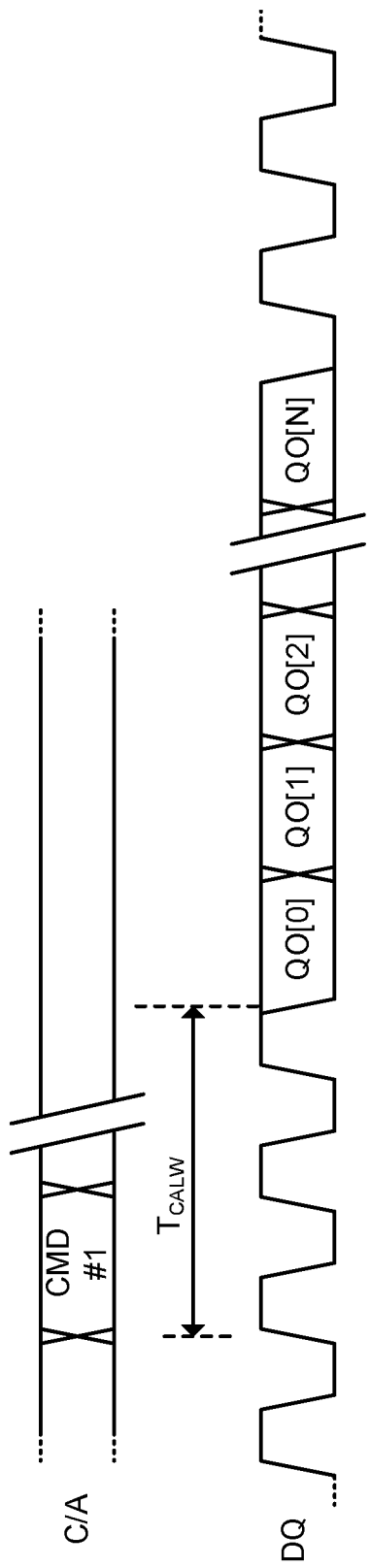
FIG. 9B is a timing diagram illustrating a transmission of calibration register values.

FIG. 9B is a timing diagram illustrating a transmission of calibration register values. In an embodiment, memory controller 710A sends a command to memory 720A that informs memory 720A that values to be written to a calibration register (e.g., global calibration registers 725 and/or one or more local calibration registers 735). After a predetermined length of time (or clock cycles), $T_{CALW}$, memory controller 710A drives the values to be written to the calibration register (QO[0:N]), to memory 720A. It should be understood that the values to be written to the calibration registers may be driven on the data line (DQ) associated with that calibration register. In this manner, calibration register values may be sent to an individual bitslice 731A without further addressing or control commands. The bitslice 730A intended to receive a particular calibration register value receives it directly on its receiver 732 and thus no addressing or selection is necessary.

In an embodiment, memory 720A may be configured with other memories in a memory rank. In other words, memory 720A may share a select signal (e.g., a chip select signal) and/or other command and control signals (e.g., C/A signals) with one or more other memories (not shown in FIG. 7A). Therefore, memory 720A and these other memories are accessed simultaneously. It should be understood that because no additional addressing or selection is required, the individual bitslices 731A of individual memories in the same rank may receive individual calibration register values without affecting the calibration values of other memories in the same rank.

It should be understood that memory controller 710A may receive phase data bits associated with a first bitslice via a second bitslice. This eliminates the need to stop driving a calibration bit pattern in order to read values sampled by samplers 734. Typically, memory 720A has multiple modes used to send phase data bits back to memory controller 710A. Each of these modes may be associated with a particular phase of CKI or CKQ. In other words, memory 720A may have a mode that sends the phase data bits associated with the rising edge of CKI, the falling edge of CKI, the rising edge of CKQ, and/or the falling edge of CKQ. Thus, for a given mode, memory 720A may only send back samples associated with one edge of the quadrature clocks. As the phase of the selected clock edge is swept, the data bits sent back to memory controller 710A may start at a first solid logic value (e.g., a logic high), go metastable, then become a steady logic value the opposite of the first logic value (e.g., a logic low). By using multiple modes, for multiple clock edges, the data being sent by memory 720A back to memory controller 710A may be sent at a lower speed than quadrature clocks CKI and CKQ are toggling.

Figure 9C:
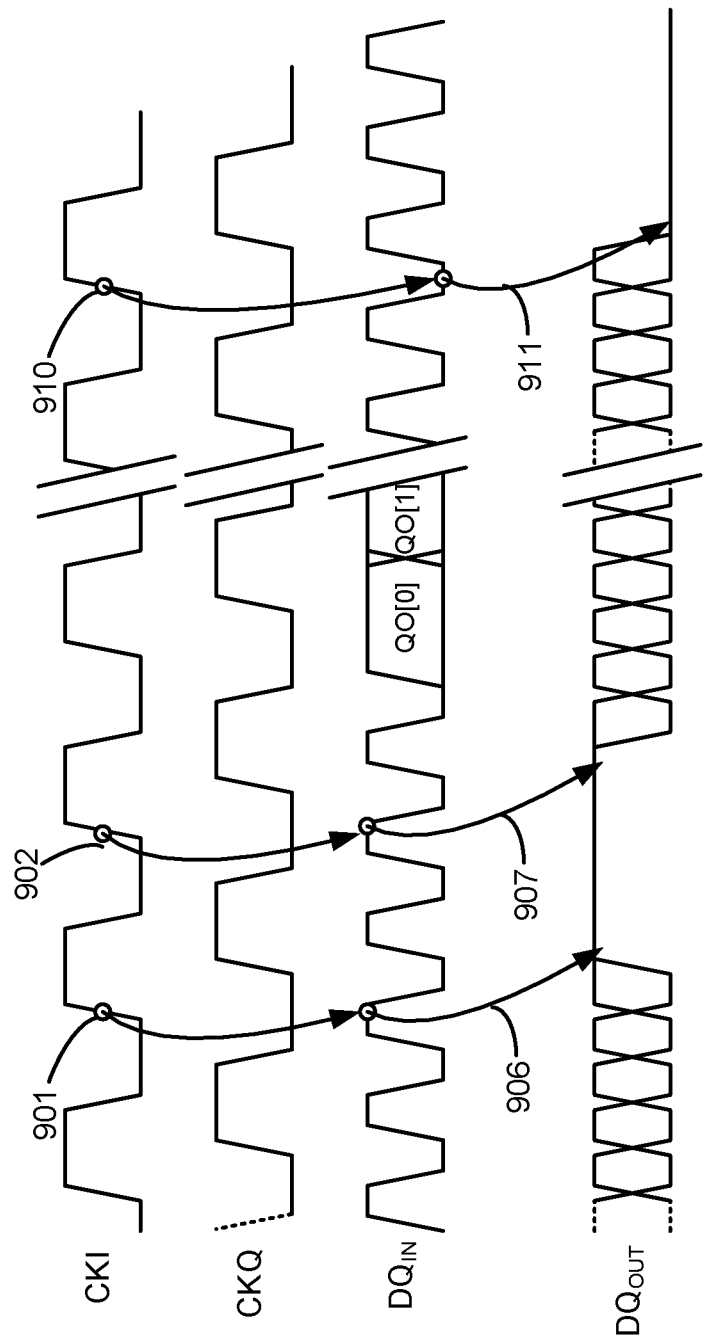
FIG. 9C is a timing diagram illustrating a loopback transmission of sampled signal values.

FIG. 9C is a timing diagram illustrating a loopback transmission of sampled signal values. FIG. 9C illustrates the alignment of the rising edge of CKI. It should be understood that a similar diagram can be drawn to illustrate the other modes of operation that calibrate the falling edge of CKI, the rising edge of CKQ, and the falling edge of CKQ. In an embodiment, the samples taken by a first one of bitslices 730A (e.g., $DQ_{IN}$) may be sent back to memory controller 710A using a driver associated with a second one of bitslices 730A (e.g., $DQ_{OUT}$). In FIG. 9C a sample associated with the rising edge of CKI is taken of the $DQ_{IN}$ input. This is illustrated by arrow 901. The value sampled by the bitslice 730A associated with $DQ_{IN}$ (in this illustration, a logic high) is sent to the bitslice associated with $DQ_{OUT}$. This is illustrated by arrow 906. Arrow 906 terminates at a point of the $DQ_{OUT}$ waveform where $DQ_{OUT}$ is a logic high. Another sample associated with the rising edge of CKI is taken of the $DQ_{IN}$ input. This sample is illustrated by arrow 902. The value sampled by the bitslice 730A associated with $DQ_{IN}$ after the phase adjustment of CKI (in this illustration, still a logic high) is sent to the bitslice associated with $DQ_{OUT}$. This is illustrated by arrow 907. Arrow 907 terminates at a point of the $DQ_{OUT}$ waveform where $DQ_{OUT}$ is a logic high.

In order to sweep the clock edge being used to sample, at some point in time, memory controller 710A sends a command to memory 720A that informs memory 720A that values to be written to a calibration register (e.g., global calibration registers 725 and/or one or more local calibration registers 735). After a predetermined length of time (or clock cycles), $T_{CALW}$, memory controller 710A drives the values to be written to the calibration register (QO[0:N]), to memory 720A. This is illustrated in FIG. 9C by the data QO[0] and QO[1]. After the calibration registers have been written internal to memory 720A, a timing of CKI, CKQ, or both has been adjusted. A sample associated with the adjusted rising edge of CKI is taken of the $DQ_{IN}$ input. This is illustrated by arrow 910. The value sampled by the bitslice 730A associated with $DQ_{IN}$ (in this illustration, a logic low) is sent to the bitslice associated with $DQ_{OUT}$. This is illustrated by arrow 911. Arrow 911 terminates at a point of the $DQ_{OUT}$ waveform where $DQ_{OUT}$ is a logic low.

Figure 10:
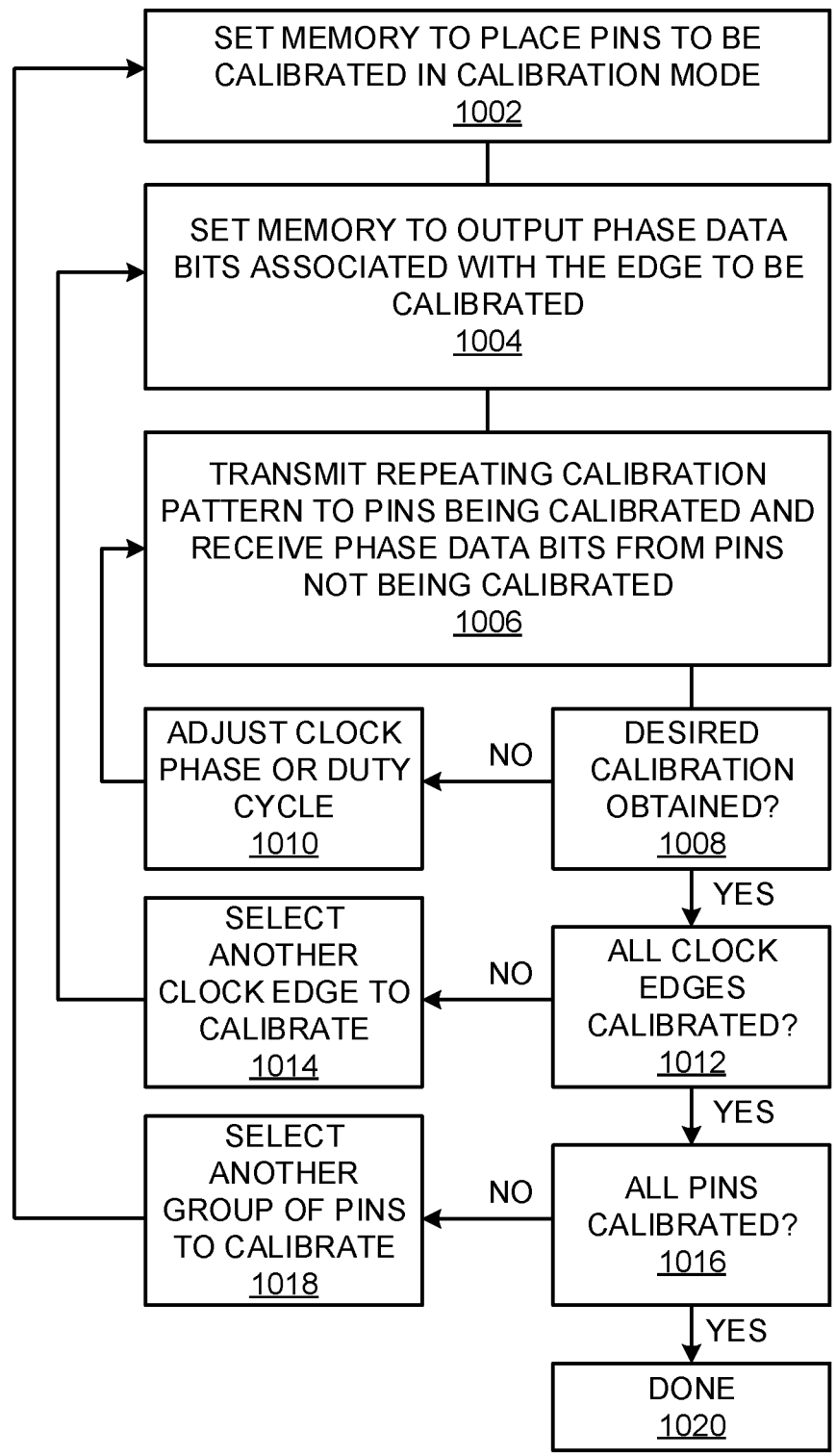
FIG. 10 is a flowchart illustrating a method of calibrating.

FIG. 9C may be better understood with reference to FIG. 10. FIG. 10 is a flowchart illustrating a method of calibrating. The steps illustrated in FIG. 10 may be performed by one or more elements of memory system 700. In the first step of the flowchart, a memory is set to place pins to be calibrated in a calibration mode (1002). For example, memory 720A or memory 720B may place a group of pins in a calibration mode. Memory controller 710A or memory 720B may cause this group of pins to be placed in a calibration mode by setting one or more values stored in global calibration registers 725 or local calibration registers 735. In an embodiment, this group of pins is a portion of a bus (e.g., one-half of a DQ[0:N] bus). This portion may be ½ or less of the pins associated with the bus.

In the next step of the flowchart, the memory is set to output phase data bits associated with the edge to be calibrated (1004). For example, memory 720A or memory 720B may set a group of pins that are not in the calibration mode set in block 1002 to output phase data bits. Memory controller 710A or memory 720B may cause this group of pins to output phase data bits associated with one of the rising or falling edges of either CKI or CKQ by setting one or more values stored in global calibration registers 725 or local calibration registers 735. In an embodiment, the group of pins set to output phase data bits are each adjacent to the pins set in block 1002. In this manner, the phase data bit sampled by the pins in the calibration mode may be sent to a neighboring pin. This reduces the distance a phase data bit must be communicated from the pin where it was sampled to a pin that is driving it back to memory controller 710A or 710B.

In the next step of the flowchart, a repeating calibration pattern is transmitted to the pins being calibrated and phase data bits are received from pins not being calibrated (1006). For example, memory controller 710A or memory controller 710B may transmit a repeating calibration pattern to the pins in calibration mode. In an example, this repeating calibration pattern may be selected from the patterns given in Table 2. In another example, this repeating calibration pattern may be a series of alternating 1's and 0's toggling at the quadrature clock edge rate (as illustrated in FIG. 9C).

In the next step of the flowchart, it is determined if the desired calibration was obtained (1008). If the desired calibration was obtained, flow proceeds to block 1012. If the desired calibration was not obtained, flow proceeds to block 1010. If the desired calibration was not obtained, in the next step of the flowchart, a clock phase or duty cycle is adjusted (1010). For example, calibration control 719 or calibration control 729 may adjust a clock phase or duty cycle by setting values stored in local calibration registers 725 and/or global calibration register 735. After a clock phase or duty cycle is adjusted, in the next step of the flowchart, flow proceeds to block 1006.

If the desired calibration was obtained, in the next step of the flowchart, it is determined if all of the clock edges have been calibrated (1012). If all of the clock edges have been calibrated, flow proceeds to block 1016. If not all of the clock edges have been calibrated, flow proceeds to block 1014. If not all of the clock edges had been calibrated, in the next step of the flowchart, another edge is selected to be calibrated (1014). For example, after the rising edge of CKI is calibrated, the falling edge of CKI may be calibrated. After calibrating the falling edge of CKI, the rising edge of CKQ may be calibrated. After calibrating the rising edge of CKQ, the falling edge of CKQ may be calibrated. After another clock edge is selected to be calibrated, in the next step of the flowchart, flow proceeds to block 1004.

If all of the clock edges have been calibrated, in the next step of the flowchart, it is determined if all of the pins have been calibrated (1016). If all of the pins have been calibrated, in the next step of the flowchart, flow proceeds to end in block 1020. If not all of the pins have been calibrated, flow proceeds to block 1018. If not all of the pins have been calibrated, in the next step of the flowchart, another group of pins is selected for calibration (1018). For example, memory 720A or memory 720B may select a portion of the bus (e.g., the other one-half of the DQ[0:N] bus) for calibration that was previously not selected for calibration.

It should be understood that the pins set to output phase data bits (i.e., in block 1004) may only be set during the calibration of one of the rising or falling edges of either CKI or CKQ. In other words, the outputting of phase data on pins not being calibrated may only be performed for a write levelization step (e.g., calibrating the rising edge of CKI), but an internal finite state machine (e.g., calibration control 729) may receive the phase data via an on-chip path for the rest of the clock calibration (e.g., calibrating the falling edge of CKI and the rising and falling edges of CKQ).

Figure 9D:
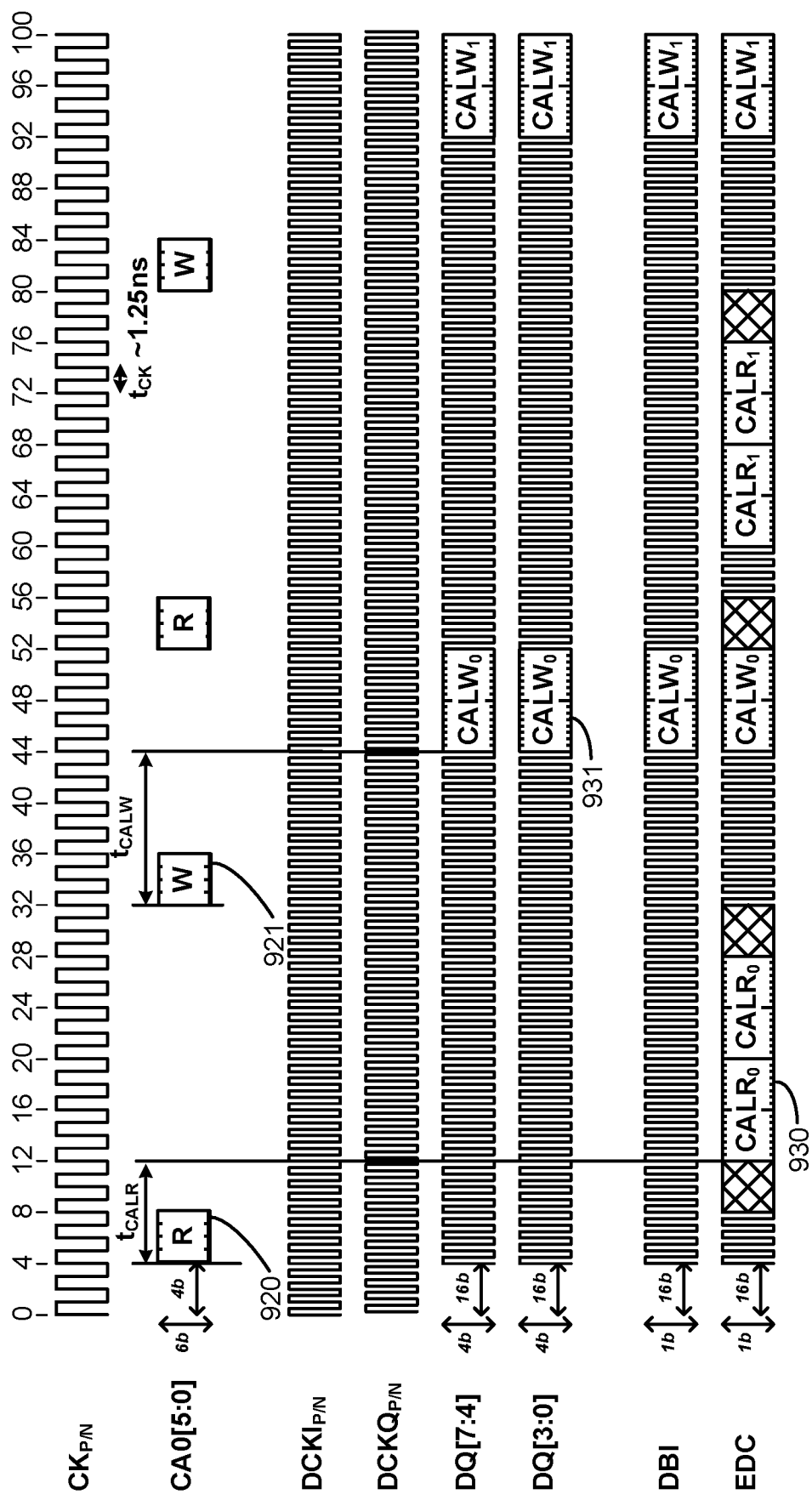
FIG. 9D is a timing diagram illustrating transmission of sampled signal values and calibration register values.

FIG. 9D is a timing diagram illustrating the transmissions of sampled signal values and calibration register values. Similar to FIG. 9A, a read command 920 is sent to memory 720A by memory controller 710A. At some time later ($t_{CALR}$), the read data 930 (i.e., the phase data bits which are associated with the samples taken by samplers 734) is driven by memory 720A and received by memory controller 710A.

Similar to FIG. 9B, a write calibration values command 921 is sent to memory 720A by memory controller 710A. At some time later ($t_{CALW}$), the values to be written into one or more calibration registers 931 are sent, on the lines associated with those calibration registers, by memory controller 710A. It should be understood that while some signal pins may be unidirectional during normal memory operation (i.e. they may be configured to only receive write data or only drive read data), in some embodiments, each pin may support both transmit and receive functions in order to help calibrate clock settings as described above with reference to FIG. 10.

Figure 9E:
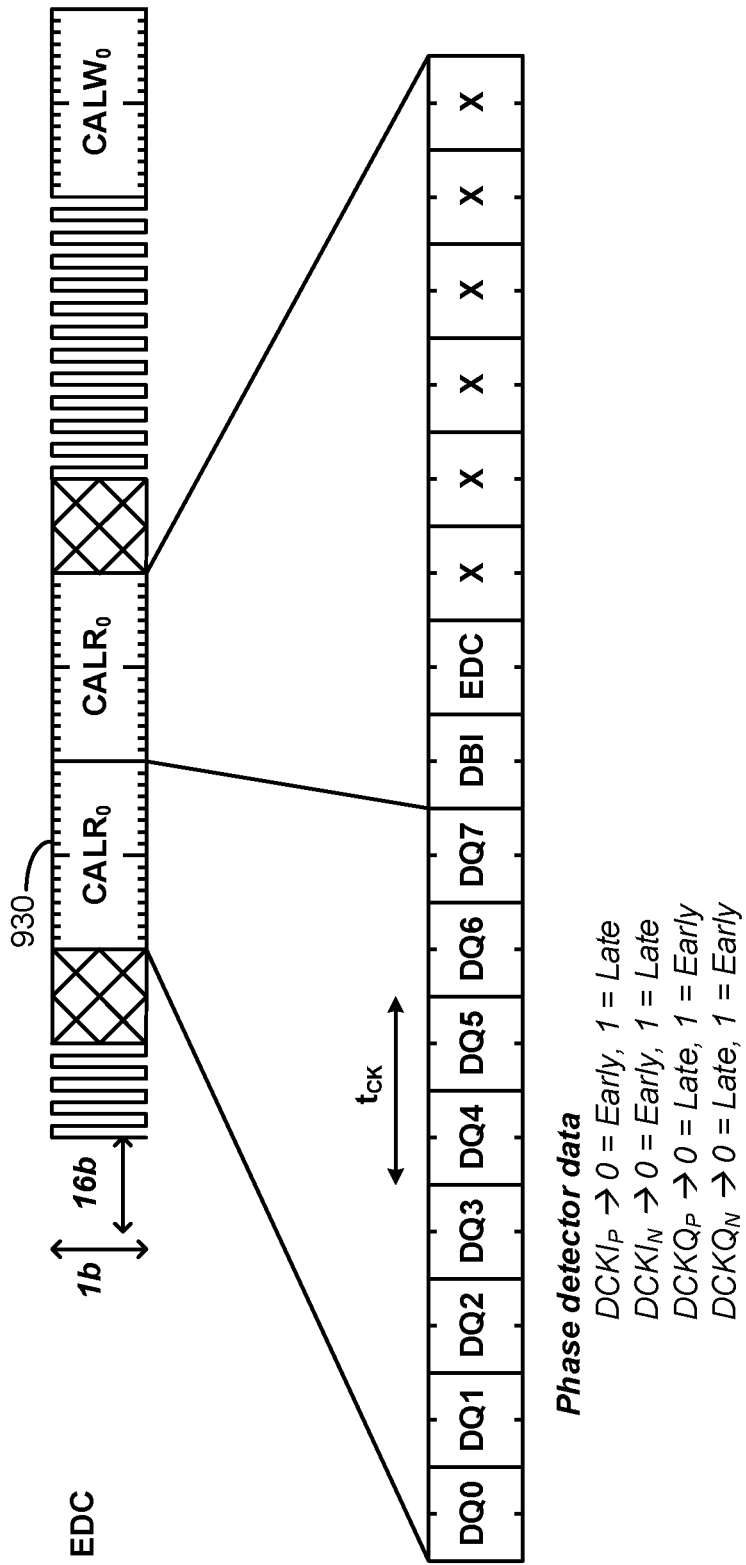
FIG. 9E is a timing diagram illustrating a transmission of sampled signal values.

FIG. 9E is a timing diagram illustrating a transmission of sampled signal values. In particular, FIG. 9E illustrates details of read data 930. In an embodiment, the result of each data pin's phase detector is output in a serial sequence on a single pin (e.g. the EDC pin) as illustrated by the labels DQ0 through DQ7, DBI, and EDC in FIG. 9E. In an embodiment, the phase detector outputs can be interpreted as indicating whether a clock edge is too early or too late.

Figure 9F:
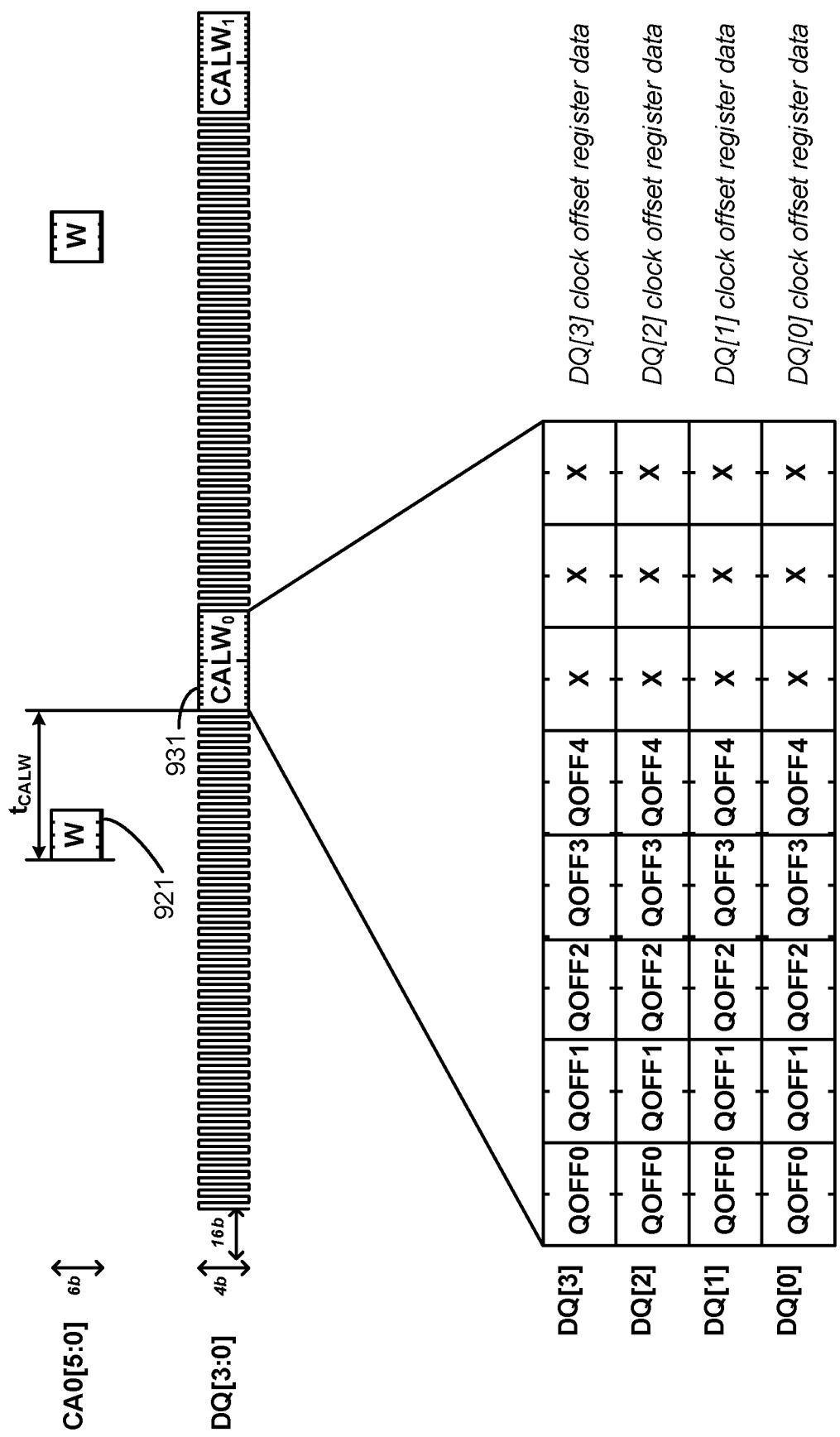
FIG. 9F is a timing diagram illustrating a transmission of calibration register values.

FIG. 9F is a timing diagram illustrating a transmission of calibration register values. In particular, FIG. 9F illustrated details of calibration write data 931. In an embodiment, QOFF is a field specifying a specific offset. Thus, in FIG. 9F a five bit field (QOFF0-QOFF4) is illustrated. The offset specified by the QOFF field may be any setting. In an embodiment, the QOFF field may specify a quadrature offset between CKI and CKQ, the duty cycle of CKI, or the duty cycle of CKQ.

In an embodiment, each pin receives the QOFF field for that pin. This allows the device and pin receiving the QOFF field to be addressed individually (i.e., other devices and other pins do not necessarily receive the same QOFF field value simply because they are connected to a same C/A bus.) It should also be understood that in FIG. 9F, the illustration of the QOFF field being sent or received, by memory controller 710A, 710B or memory 720A, 720B, respectively, on DQ[3:0] is merely an example. QOFF fields for other data group pins (i.e., not C/A pins) can be sent or received. Examples of other data group pins that can send or receive QOFF fields include EDC, TRS, DBI (Data Bus Inversion), DM (Data Mask), etc. It should also be understood that this method of addressing registers may be used for other device or pin specific fields beyond those used for quadrature clock calibration.

Figure 11A:
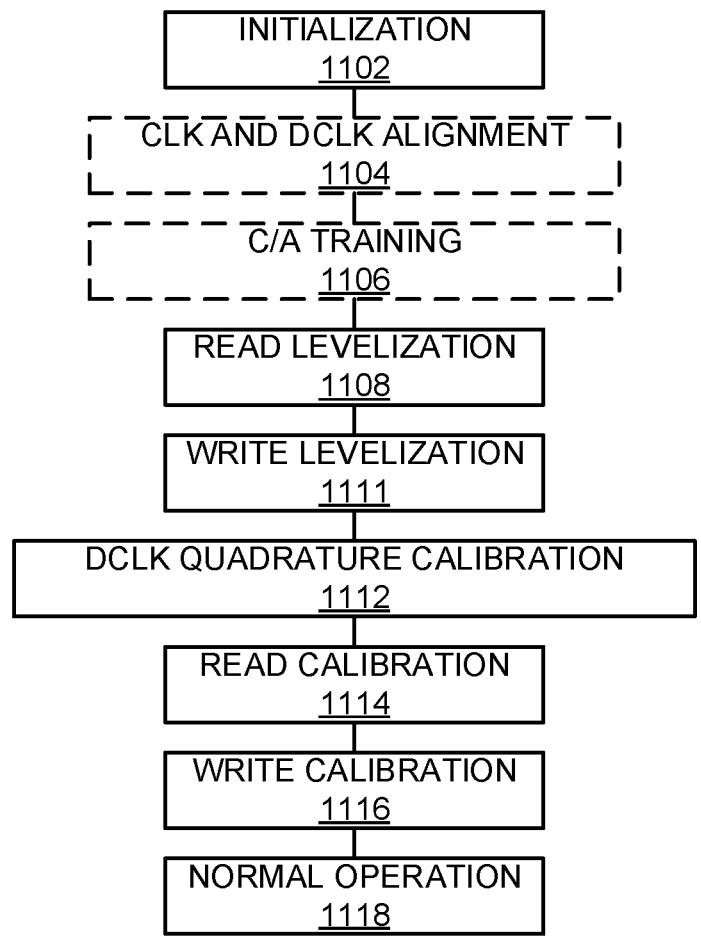
FIGS. 11A and 11B are flowcharts illustrating methods of calibrating.

FIG. 11A is a flowchart illustrating a method of calibrating. The steps illustrated in FIG. 11A may be performed by one or more elements of memory system 700. The system is initialized (1102). For example, memory controller 710A may write initial values to global calibration registers 725 and local calibration registers 735. The initialization step may also include such activities as impedance calibration, voltage reference (Vref) calibration; receiver offset calibration, built-in self test (BIST), etc. Optionally, CLK and DCLK are aligned (1104). Optionally, training is performed on a command/address bus (1006). This training allows commands and addresses to be sent to memory 720A.

Read levelization is performed (1108). After read levelization, the values in global calibration register 725 and local calibration register 735 may not allow for full speed operation of bitslices 730A, but may be good enough to allow one of CKI or CKQ to operate to drive data to memory controller 710A at a reduced (e.g., ½) data rate. Write levelization is performed (1110). After write levelization, the memory controller data transmit timing and the values in global calibration register 725 and local calibration register 735 may not allow for full speed operation of bitslices 730A, but may be good enough to allow one of CKI or CKQ to operate to clock data into samplers 734 at a reduced (e.g., ½) data rate.

DCLK quadrature calibration is performed (1112). For example, calibration controller 719 may set global calibration registers 725 and local calibration registers 735 to adjust CKI and CKQ, internal to bitslices 730A, to have 50% duty cycles, and a quadrature phase that is approximately ¼ of the cycle time of CKI and CKQ. Calibration controller may set global calibration registers 725 and local calibration registers 735 based on data received from samplers 734 and sent to memory controller 710A.

Read calibration is performed (1114). Write calibration is performed (1116). These calibrations allow memory controller 710A and memory 720A to exchange data at full speed. Then, normal operation is entered (1118).

Figure 11B:
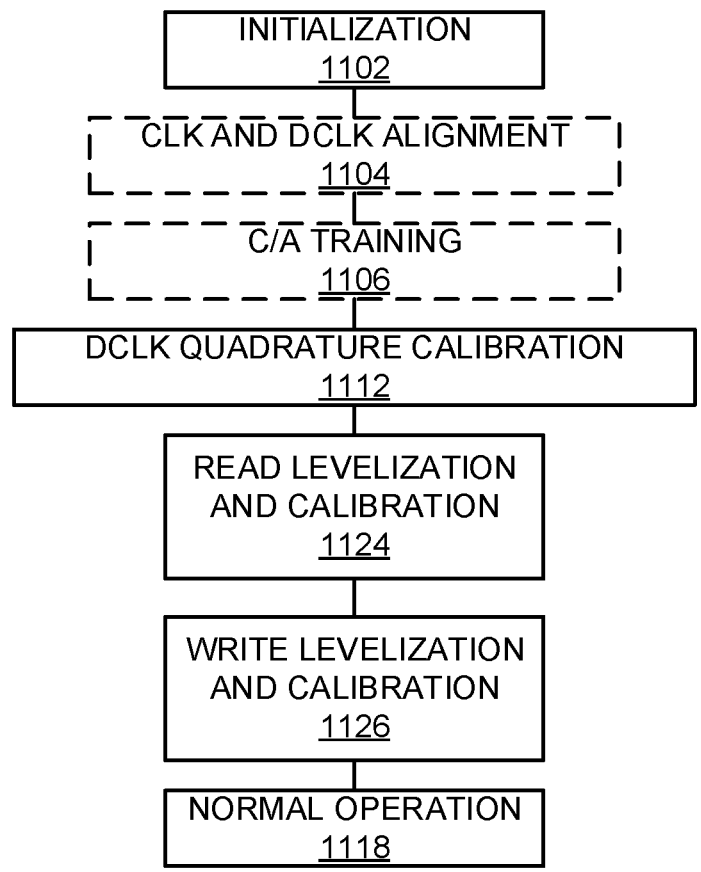

FIG. 11B is a flowchart illustrating a method of calibrating. The steps illustrated in FIG. 11B may be performed by one or more elements of memory system 701. The system is initialized (1102). For example, memory controller 710B may write initial values to global calibration registers 725 and local calibration registers 735. Optionally, CLK and DCLK are aligned (1104). Optionally, training is performed on a command/address bus (1106). This training allows commands and addresses to be sent to memory 720B.

DCLK quadrature calibration is performed (1112). For example, calibration controller 729 may set global calibration registers 725 and local calibration registers 735 to adjust CKI and CKQ, internal to bitslices 730B, to have 50% duty cycles, and a quadrature phase that is approximately ¼ of the cycle time of CKI and CKQ. Calibration controller may set global calibration registers 725 and local calibration registers 735 based on data received from samplers 734.

Read levelization and calibration is performed (1024). Write calibration and levelization is performed (1126). These calibrations allow memory controller 710B and memory 720B to exchange data at full speed. Then, normal operation is entered (1118).

It should be understood, with reference to FIGS. 11A and 11B, that by having calibration control 729 on memory 720A instead of memory controller 710B, a rough read levelization (i.e., boxes 1108 and 1110) of the values in global calibration register 725 and local calibration register 735 which does not allow for full speed operation of bitslices 730B may not be necessary.

Figure 12:
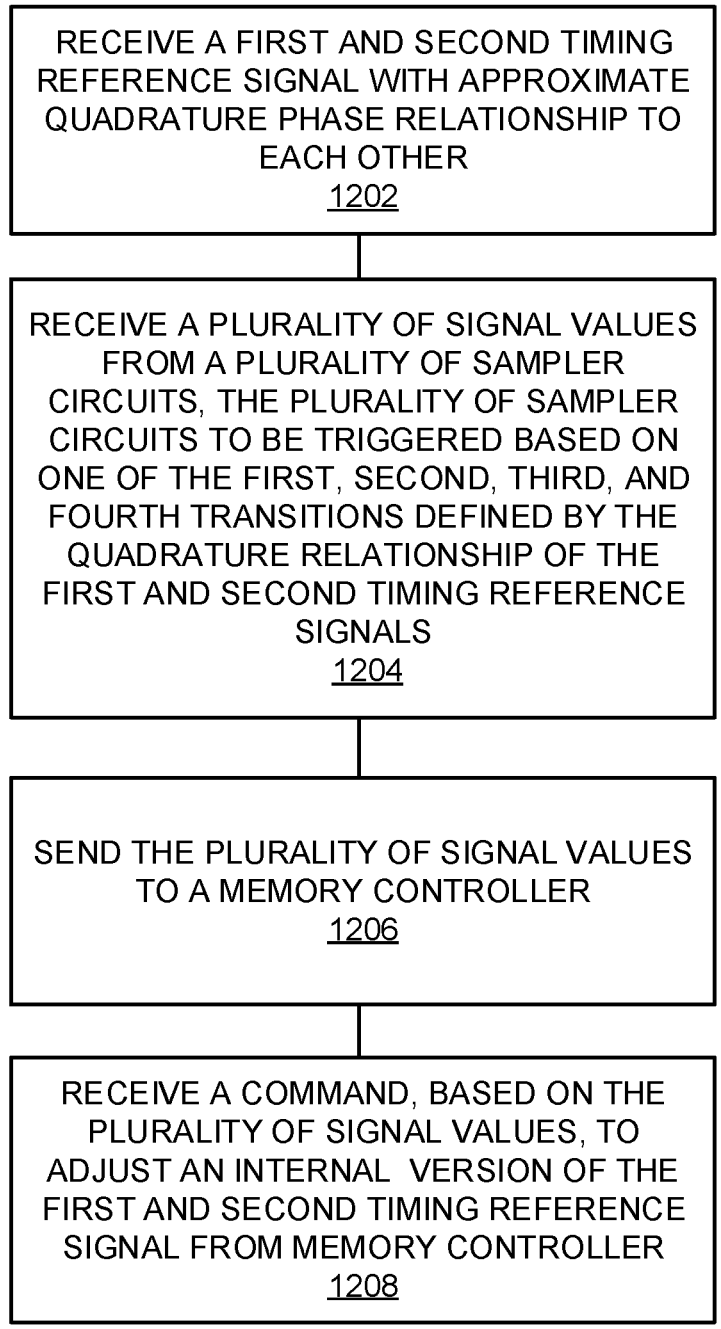
FIG. 12 is a flowchart illustrating a method of adjusting internal timing references.

FIG. 12 is a flowchart illustrating a method of calibrating. The steps illustrated in FIG. 12 may be performed by one or more elements of memory system 700. A first and second timing reference signals, with an approximate quadrature phase relationship to each other, are received (1202). For example, memory 720 may receive uncalibrated CKI and CKQ signals from memory controller 710.

A plurality of signal values from a plurality of sampler circuits are received. The plurality of sampler circuits are triggered based on one of the first, second, third, and fourth transitions defined by the quadrature relationship of the first and second timing reference circuits (1204). For example, memory 720 may sample, using samplers 734, values in each bitslice 730 that are associated with an edge of CKI or CKQ. The values may be received at the inputs to MUX 726. In an embodiment, a value written by memory controller 710 to global calibration registers 725 or local calibration registers 735, sets the control input of MUX 736. In another embodiment, a dedicated command sent to memory 720 determines the control input of MUX 736. MUX 736 determines which sampler 734 output in each bitslice 730 is selected to be sent to memory controller 710. In another embodiment, all of the sampler 734 outputs are sent to memory controller 710.

The plurality of signal values are sent to a memory controller (1206). For example, memory 720 may sweep the value at the control input of MUX 726 so that the values output by each bitslice are serially sent to memory controller 710. In an embodiment, this is performed in response to a command from memory controller 710.

A command that is based on the plurality of signal values is received from the memory controller. This command is to adjust an internal version of the first and second timing reference signal (1208). For example, a command to set at least one value in global calibration registers 725 or local calibration registers 735 is received by memory 720. The value set may affect an internal duty cycle or quadrature phase of an internal version of CKI and/or CKQ.

The steps illustrated in FIG. 12 may also be performed by memory system 701. However, it should be understood, that because calibration control 729 is included in memory 720B, steps 1202, 1204, and 1208 may be performed by memory system 701 without performing step 1206.

Figure 13:
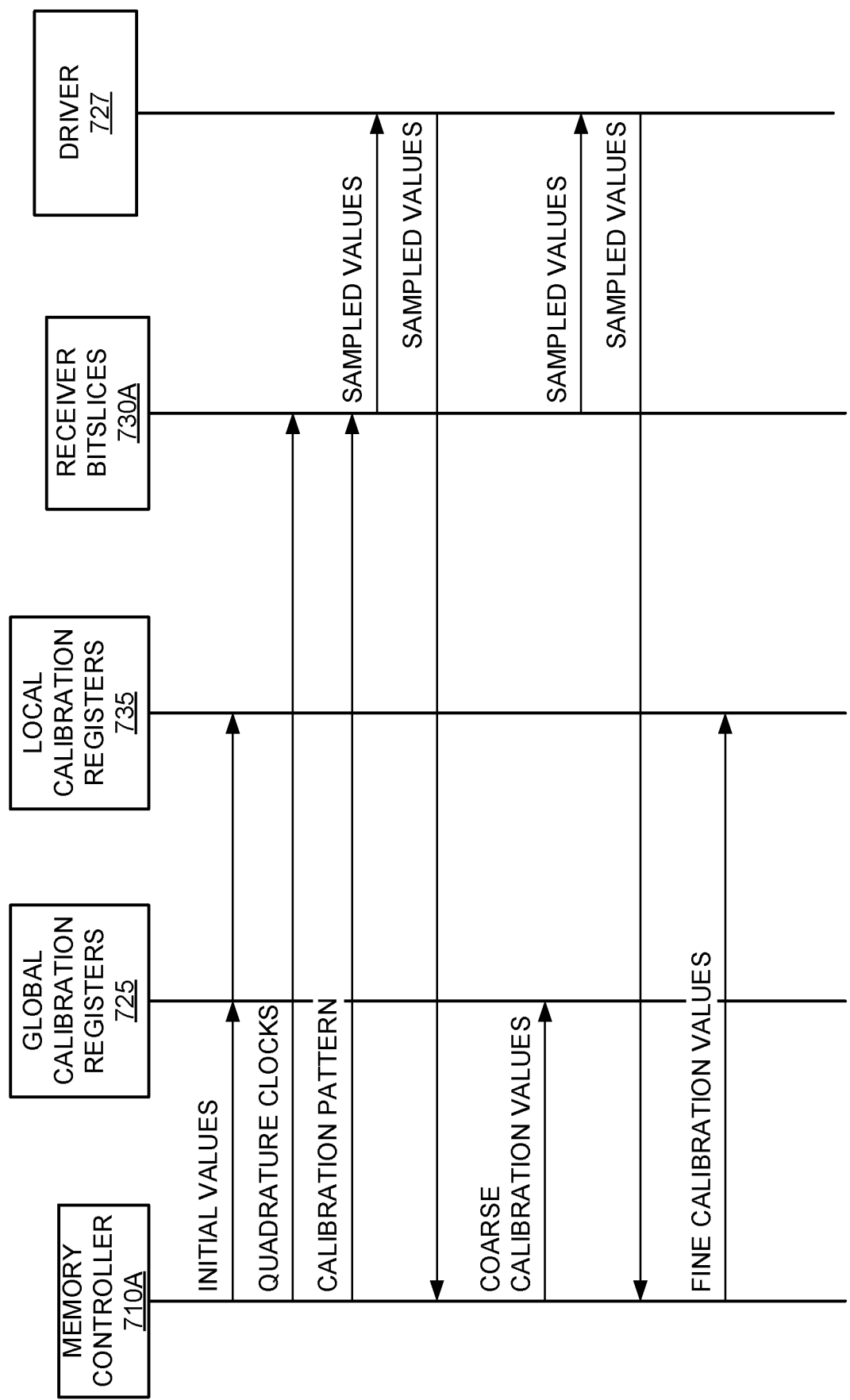
FIG. 13 is a flow diagram illustrating a method of calibrating.

FIG. 13 is a flow diagram illustrating a method of calibrating. The flows and steps illustrated in FIG. 13 may be performed by one or more elements of memory system 700. Initial values are sent from memory controller 710A to global calibration registers 725 and/or local calibration registers 735. Memory controller 710A sends quadrature clocks (i.e., CKI and CKQ) to memory 720A which are in turn, internal to memory 720A, sent to receiver bitslices 730A. Memory controller 710A sends a calibration pattern (e.g., 1010101 . . . ) to bitslices 730A. In response to the quadrature clock signals, receiver bitslices sample and send sampled values of the calibration pattern to a driver 727. The driver 727 sends the sampled values to memory controller 710A.

Based on the sampled values, memory controller 710A send global calibration values to global calibration registers 725. After the global calibration values are received, receiver bitslices sample and send sampled values of the calibration pattern to driver 727. The driver 727 sends the sampled values to memory controller 710A. Based on the sampled values, memory controller 710A send local calibration values to local calibration registers 735. From the foregoing, it should be understood that regardless of where the calibration control state machine is located (i.e., memory controller 710A or memory 720B) having a global clock adjust (e.g., global clock adjust 723) allows errors common to all bitslices 730A and 730B to be corrected with a smaller number of adjustments than would be typical if all adjustments were performed inside of each individual bitslice 730A and 730B.

The methods, systems and devices described above may be implemented in computer systems, or stored by computer systems. The methods described above may also be stored on a computer readable medium. Devices, circuits, and systems described herein may be implemented using computer-aided design tools available in the art, and embodied by computer-readable files containing software descriptions of such circuits. This includes, but is not limited to memory systems 100, 700 and 701, memory controllers 110, 710A, and 710B and memories 120, 720A, and 720B, and their components. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 14:
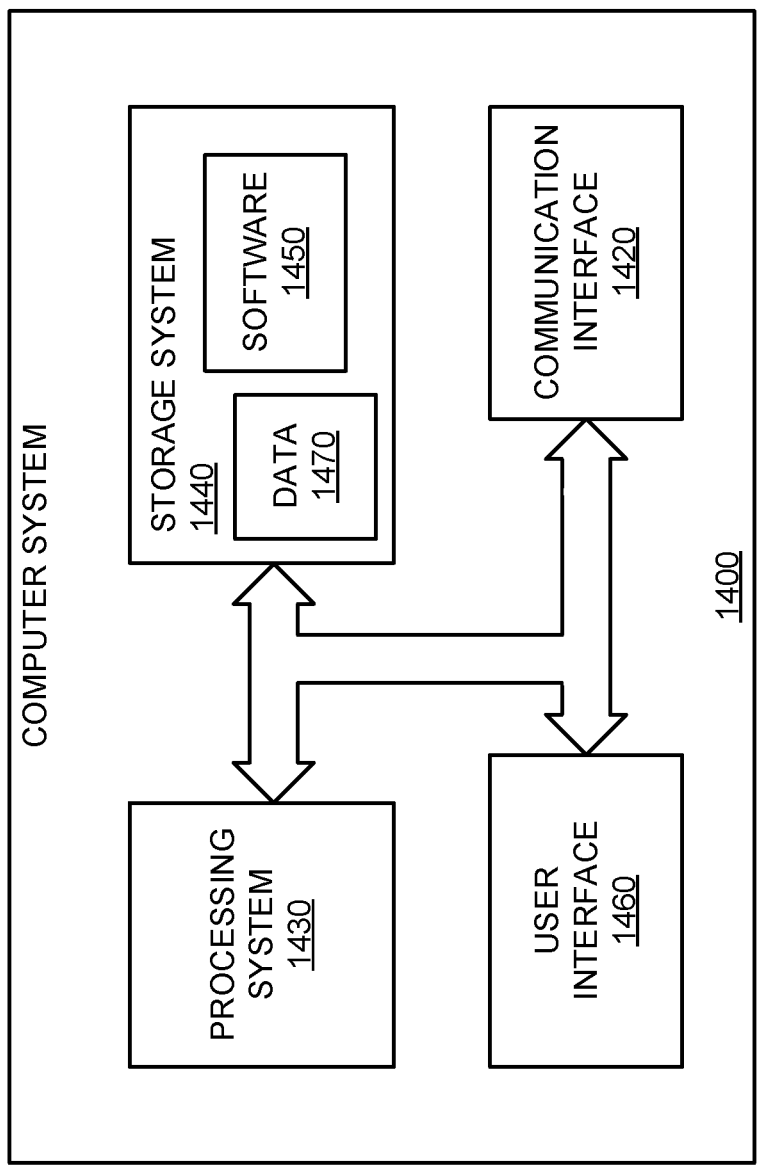
FIG. 14 is a block diagram of a computer system.

FIG. 14 illustrates a block diagram of a computer system. Computer system 1400 includes communication interface 1420, processing system 1430, storage system 1440, and user interface 1460. Processing system 1430 is operatively coupled to storage system 1440. Storage system 1440 stores software 1450 and data 1470. Storage system 1440 may include one or more of memory systems 100, 700 and 701, memory controllers 110, 710A and 710B, or memories 120, 720A and 720B. Processing system 1430 is operatively coupled to communication interface 1420 and user interface 1460. Computer system 1400 may comprise a programmed general-purpose computer. Computer system 1400 may include a microprocessor. Computer system 1400 may comprise programmable or special purpose circuitry. Computer system 1400 may be distributed among multiple devices, processors, storage, and/or interfaces that together comprise elements 1420-1470.

Communication interface 1420 may comprise a network interface, modem, port, bus, link, transceiver, or other communication device. Communication interface 1420 may be distributed among multiple communication devices. Processing system 1430 may comprise a microprocessor, microcontroller, logic circuit, or other processing device. Processing system 1430 may be distributed among multiple processing devices. User interface 1460 may comprise a keyboard, mouse, voice recognition interface, microphone and speakers, graphical display, touch screen, or other type of user interface device. User interface 1460 may be distributed among multiple interface devices. Storage system 1440 may comprise a disk, tape, integrated circuit, RAM, ROM, EEPROM, flash memory, network storage, server, or other memory function. Storage system 1440 may include computer readable medium. Storage system 1440 may be distributed among multiple memory devices.

Processing system 1430 retrieves and executes software 1450 from storage system 1440. Processing system 1430 may retrieve and store data 1470. Processing system 1430 may also retrieve and store data via communication interface 1420. Processing system 1430 may create or modify software 1450 or data 1470 to achieve a tangible result. Processing system 1430 may control communication interface 1420 or user interface 1460 to achieve a tangible result. Processing system 1430 may retrieve and execute remotely stored software via communication interface 1420.

Software 1450 and remotely stored software may comprise an operating system, utilities, drivers, networking software, and other software typically executed by a computer system. Software 1450 may comprise an application program, applet, firmware, or other form of machine-readable processing instructions typically executed by a computer system. When executed by processing system 1430, software 1450 or remotely stored software may direct computer system 1400 to operate as described herein.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A memory device, comprising:
   a first register to store a first configuration value associated with a first one of a plurality of bitslices, the plurality of bitslices to send and receive data, the data to be stored and retrieved by the memory device; and,
   a second register to store a second configuration value associated with a second one of the plurality of bitslices, the first configuration value to be addressed to the first register by being received by the first one of the plurality of bitslices and the second configuration value to be addressed to the second register by being received by the second one of the plurality of bitslices.

2. The memory device of claim 1, wherein a first timing adjustment is determined by the first configuration value.

3. The memory device of claim 2, wherein a second timing adjustment is determined by the second configuration value.

4. The memory device of claim 3, wherein the first timing adjustment to affect a first internal timing of the first bitslice, the second timing adjustment to affect a second internal timing of the second bitslice, the second configuration value not to affect the first internal timing of the first bitslice, the first configuration value not to affect the second internal timing.

5. The memory device of claim 4, wherein the first internal timing and the second internal timing affect a same timing parameter of the first bitslice and the second bitslice, respectively.

6. The memory device of claim 5, wherein the same timing parameter is associated with a quadrature clock duty cycle.

7. The memory device of claim 5, wherein the same timing parameter is associated with a quadrature phase offset of a quadrature clock.

8. A memory controller, comprising:
   a first circuit to send, to a memory device, a first configuration value associated with a first one of a plurality of bitslices of the memory device, the plurality of bitslices to send and receive data, the data to be stored and retrieved by the memory device; and,
   a second circuit to send, to the memory device, a second configuration value associated with a second one of the plurality of bitslices of the memory device, the first configuration value to be addressed to the first register by being sent to at least the first one of the plurality of bitslices and the second configuration value to be addressed to the second register by being sent to at least the second one of the plurality of bitslices.

9. The memory controller of claim 8, wherein a first timing adjustment internal to the memory device is determined by the first configuration value.

10. The memory controller of claim 9, wherein a second timing adjustment internal to the memory device is determined by the second configuration value.

11. The memory controller of claim 10, wherein the first timing adjustment is to affect a first internal timing of the first bitslice, the second timing adjustment to affect a second internal timing of the second bitslice, the second configuration value not to affect the first internal timing of the first bitslice, the first configuration value not to affect the second internal timing.

12. The memory controller of claim 11, wherein the first internal timing and the second internal timing affect a same timing parameter of the first bitslice and the second bitslice, respectively.

13. The memory controller of claim 5, wherein the same timing parameter is associated with at least one of a quadrature clock duty cycle and a quadrature phase offset of a quadrature clock.

* * * * *